United States Patent
Aloni et al.

(10) Patent No.: US 10,554,149 B2
(45) Date of Patent: Feb. 4, 2020

(54) PROVIDING POSITIONAL AWARENESS INFORMATION AND INCREASING POWER QUALITY OF PARALLEL CONNECTED INVERTERS

(71) Applicant: Solaredge Technologies, Ltd., Herzeliya (IL)

(72) Inventors: Omer Aloni, Herzeliya (IL); Alon Zohar, Netanya (IL); Tzachi Glovinsky, Petah Tivka (IL); Menashe Walsh, Modi'in Illit (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 16/192,921

(22) Filed: Nov. 16, 2018

(65) Prior Publication Data

US 2019/0157984 A1    May 23, 2019

Related U.S. Application Data

(60) Provisional application No. 62/588,600, filed on Nov. 20, 2017.

(51) Int. Cl.
*H02J 3/44* (2006.01)
*H02M 7/42* (2006.01)
(Continued)

(52) U.S. Cl.
CPC ............. *H02M 7/42* (2013.01); *H02M 7/003* (2013.01); *H02M 3/158* (2013.01)

(58) Field of Classification Search
CPC ..... Y02E 10/563; H02M 3/158; H02M 7/003; H02M 7/42; H02J 3/385; H02J 1/102; H02P 21/00
(Continued)

(56) References Cited

U.S. PATENT DOCUMENTS

| 2,227,651 A | 1/1941 | Kern |
| 7,772,716 B2 * | 8/2010 | Shaver, II ............... H02H 9/041 307/31 |

(Continued)

FOREIGN PATENT DOCUMENTS

EP        2889978 A1    7/2015

OTHER PUBLICATIONS

Apr. 4, 2019—European Search Report for European App. No. 18207048.2.

*Primary Examiner* — Rajnikant B Patel
(74) *Attorney, Agent, or Firm* — Banner & Witcoff, Ltd.

(57) ABSTRACT

A method and a system sense at least one phase difference between at least two phases of a group of parallel connected three phase AC output terminals (e.g., a first phase AC output terminal, a second phase AC output terminal, or a third phase AC output terminal). The parallel connected AC output terminals may be three parallel connected DC to AC three phase inverters. Features of the parallel connected three phase AC output terminals enable wiring of conductors to one phase of an AC output terminal to be swapped with wiring of conductors of one phase of another phase AC output terminal. A sign of at least one phase difference is verified different from signs of other phase differences thereby the system determining the lateral position of the at least one three phase inverters relative to at least one other of the three phase inverters.

21 Claims, 18 Drawing Sheets

(51) Int. Cl.
*H02M 7/00* (2006.01)
*H02M 3/158* (2006.01)

(58) Field of Classification Search
USPC ........ 307/22, 43, 64–66, 75, 82; 363/34–41, 363/56.01, 71, 89, 97–98
See application file for complete search history.

(56) References Cited

U.S. PATENT DOCUMENTS

| | | | |
|---|---|---|---|
| 9,735,703 B2* | 8/2017 | Dent | H02M 7/537 |
| 9,923,487 B2* | 3/2018 | Bixel | H02M 7/5387 |
| 2003/0111103 A1* | 6/2003 | Bower | H02J 3/383 |
| | | | 136/244 |
| 2006/0152085 A1* | 7/2006 | Flett | B60L 9/30 |
| | | | 307/75 |
| 2009/0283129 A1* | 11/2009 | Foss | H02M 7/493 |
| | | | 136/244 |
| 2011/0058664 A1* | 3/2011 | Prax | H02J 3/382 |
| | | | 379/324 |
| 2013/0082636 A1* | 4/2013 | Ohori | H02P 4/00 |
| | | | 318/723 |
| 2015/0270714 A1 | 9/2015 | Talluri et al. | |
| 2015/0340869 A1* | 11/2015 | Unru | H02J 1/102 |
| | | | 307/82 |

\* cited by examiner

135

PROVIDING POSITIONAL AWARENESS INFORMATION AND INCREASING POWER QUALITY OF PARALLEL CONNECTED INVERTERS

RELATED APPLICATIONS

This application claims priority to U.S. provisional application Ser. No. 62/588,600, filed Nov. 20, 2017, entitled "APPARATUS AND METHOD TO PROVIDE POSITIONAL AWARENESS INFORMATION AND INCREASE POWER QUALITY OF PARALLEL CONNECTED INVERTERS." The content of the foregoing application is incorporated by reference in its entirety.

BACKGROUND

Monitoring and control of power systems may provide for reliable functioning and maximum yield of any power system. The simplest monitoring of a direct current (DC) to alternating current (AC) inverter may be performed by reading values on a display mounted on the housing of the inverter for example. Monitoring and control of the inverter may be performed locally in close physical proximity to the inverter or by a local wireless connection to the inverter. Monitoring and control of a power system and its components may also be done via a remote access through an internet connection. Typical parameters to be monitored and controlled may include PV array voltages, currents and powers, utility grid voltages and currents. The parameters may be used to determine efficiency of power conversion from converters, for example, direct current (DC) to DC converters and DC to alternating current (AC) inverters.

SUMMARY

This summary merely presents some concepts in a simplified form as an introductory prelude to the more detailed description provided below. This summary is not an extensive overview and is not intended to limit or constrain the detailed description or to delineate the scope of the claims.

Illustrative aspects of the disclosure disclosed herein may be with respect to a power system, the power system may include a controller, multiple power sources (e.g., DC power sources), multiple power devices (e.g., DC power devices such as DC to DC converters), multiple bi-directional power devices and multiple storage devices (e.g. batteries). Each of the power sources may be coupled to one or more power device(s). The power devices outputs may be coupled in a connection which may be a series connection of the power devices outputs, to form a serial string of power device outputs. The connection may also be a parallel connection of the power devices outputs. The serial string or the parallel connection may be coupled to a load and may also be coupled to the bi-directional power devices. Each of the bi-directional power devices may be coupled to respective storage devices. Power of each of the power sources may be measured by sensors of each of the power devices. The load may be multiple DC to AC inverters with outputs connected to a utility grid. The DC to AC inverter may be configurable to convert power from the grid (AC) to DC to supply the storage devices. The DC to AC inverter may be configurable to convert power from the power sources and/or storage devices to the load. More specifically, the inverters may be three phase inverters with AC outputs connected together such that power supplied to the load by the inverters may be a combined power to the load. The connected outputs may provide a first phase, a second phase and a third phase provided respectively on a first phase AC output terminal, a second phase AC output terminal and a third phase AC output terminal. The first phase AC output terminal, the second phase AC output terminal and the third phase AC output terminal may be provided in a junction box. The junction box may include a rail which may be utilized to mount DC circuit breakers, terminal blocks, an isolation switch and AC circuit breakers to provide protection for the connected outputs supplying a load.

Illustrative aspects of the disclosure may feature two of the conductors of the three phases of a three-phase output of at least one of the DC to AC three phase inverters being swapped and connected inside the junction box. Using the example of three DC to AC three phase inverters, an installer may mount and position the DC to AC three phase inverters to establish one of the DC to AC three phase inverters is laterally to the left or is laterally to the right of the other DC to AC three phase inverters. In other words, the installer may establish a row of inverters which may be designated as one inverter located laterally to the left of a middle inverter and the junction box and another inverter located laterally to the right of a middle inverter and the junction box. The installer may perform a termination of the cables of the outputs of the inverters in the junction box. The termination may be such that all first phase AC outputs are connected to the first phase terminal of the junction box (labeled as L1 for example). The termination may be that all the second phase AC outputs are connected to the second phase terminal of the junction box (labeled as L2 for example). The termination may be that all the third phase AC outputs are connected to the third phase terminal of the junction box (labeled as L3 for example).

Therefore, when the DC power on the pair of DC input terminals is converted to a combined AC power on the first phase AC output terminal. The second phase AC output terminal and the third phase AC output terminal, parameters may be sensed on the first phase AC output terminal, the second phase AC output terminal or the third phase AC output terminal. The parameters may be voltage, current, frequency phase angle, power factor, impedance, harmonic distortion or temperature. By virtue of two phases being swapped and connected inside the junction box, responsive to mounting of the row of inverters and the sensing of the parameters, it may become possible to verify the lateral positioning of the DC to AC three phase inverters to each other. The lateral positioning of the DC to AC three phase inverters to each other may be utilized for mapping and identification labelling of the inverters in the power system. As such the monitoring and/or sensing of the power system may allow the establishment of the power output of an identified inverter. The monitoring and/or sensing may establish the location of the identified inverter relative to other inverters. The monitoring and/or sensing may establish where a faulty inverter may be correctly located or that an inverter has been swapped, re-located or replaced without authorization.

In general, the lateral positioning of power devices (which may include, for example, DC to AC three phase inverters) to each other may be achieved by proximity sensors and respective targets located on each the housings of the power devices. Proximity sensors and their targets may be configurable to detect the presence of nearby power device to establish the lateral positioning of the power devices to each other. Alternatively, the parameters sensed of a combined power output of an inverter from the first phase AC output terminal, the second phase AC output terminal or the third phase AC output terminal may be used in a conjunction with the use of proximity sensors and respective targets. The conjunction may be further used to obtain and/or verify the lateral positions left (L) and right (R) of respective inverters relative to a middle (M) inverter and the junction box.

Illustrative aspects of the disclosure may feature an auxiliary power provided to each of the DC to AC three phase inverters from the first phase AC output terminal and a neutral terminal. The auxiliary power may be provided from the second phase AC output terminal and the neutral terminal or the third phase AC output terminal and the neutral terminal. Connections in the junction box may draw the auxiliary power from the neutral (N) and inverter L1 terminals. Auxiliary power drawn may be by connecting each L1 inverter terminal to a different phase of the combined AC power terminated and provided in the junction box. The total auxiliary power drawn by the inverters by virtue of the connection in the junction box may be divided evenly among the phases of the combined three-phase AC output. The connection divided evenly among the phases may improve the load balancing and harmonic content of the combined three-phase AC output.

As noted above, this Summary is merely a summary of some of the features described herein. It is not exhaustive, and it is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

DETAILED DESCRIPTION

In the following description of various illustrative aspects of the disclosure, reference is made to the accompanying drawings, which form a part hereof, and in which is shown, by way of illustration, various aspects of the disclosure in which aspects of the disclosure may be practiced. It is to be understood that other aspects of the disclosure may be utilized and structural and functional modifications may be made, without departing from the scope of the present disclosure.

Figure 1A:
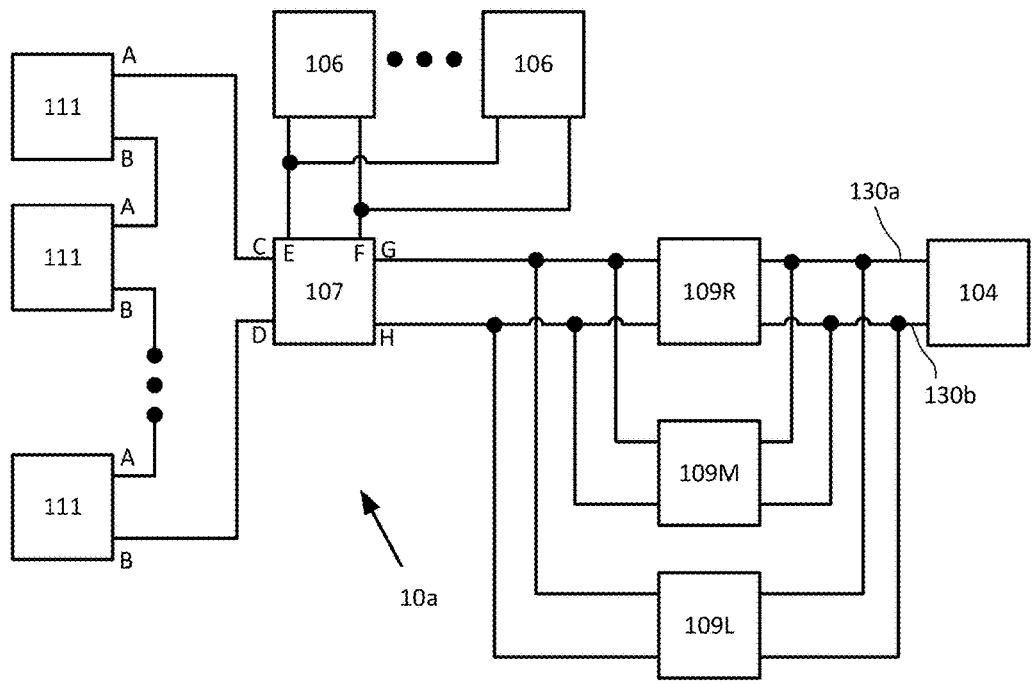
FIG. 1A illustrates a block diagram of a power system, according to one or more illustrative aspects of the disclosure.

Reference is now made to FIG. 1A, which illustrates a block diagram of a power system 10a, according to illustrative aspects of the disclosure. Power system 10a includes multiple wiring configurations 111. Each wiring configuration 111 may include one or more power sources (not shown) which may be connected to a respective power device (also not shown). Power sources may be AC power sources (e.g., wind turbines, photovoltaic panels coupled to microinverters or having integrated microinverters, etc.) or sources of DC power derived from wind turbines, battery banks, photovoltaic solar panels, rectified alternating current (AC) or petrol generators for example. Each wiring configuration 111 may include output terminals A and B. The outputs on terminals A and B of the wiring configurations 111 may be connected in series to form a series connection of wiring configuration 111 outputs. The series connection of wiring configuration 111 outputs may be connected to input terminals C and D of a link unit 107.

According to different aspects of the disclosure, one or more wiring configuration 111 does not include power devices. For example, in some aspects, a wiring configuration 111 of FIG. 1A or FIG. 1B includes a single power generator, or multiple power generators connected in series or parallel.

One or more storage devices 106 may be connected to terminals E and F of link unit 107. Storage devices 106 may be batteries, flywheels and/or super capacitors for example. Terminals E and F of link unit 107 may be configurable. Configurability of terminals E and F may allow storage devices 106 to be charged from wiring configurations 111. Configurability of terminals E and F may allow system power devices 109 to be discharged into load 104 via system power devices 109. One or more system power devices 109 may be connected together with respective inputs and outputs connected in parallel. The inputs of system power devices 109 may be connected to terminals G and H of link unit 107. Three system power devices 109R, 109M and 109L are shown with respective inputs and outputs connected in parallel. The outputs of system power devices 109 may be connected to load 104 and/or multiple loads 104. System power devices 109 according to illustrative aspects of the disclosure may be DC to AC inverters and load 104 may be an AC utility grid for example. As another example, system power devices 109 may be combiner boxes, and load 104 may be a utility grid or a DC to AC inverter connected to an AC utility grid.

Figure 1B:
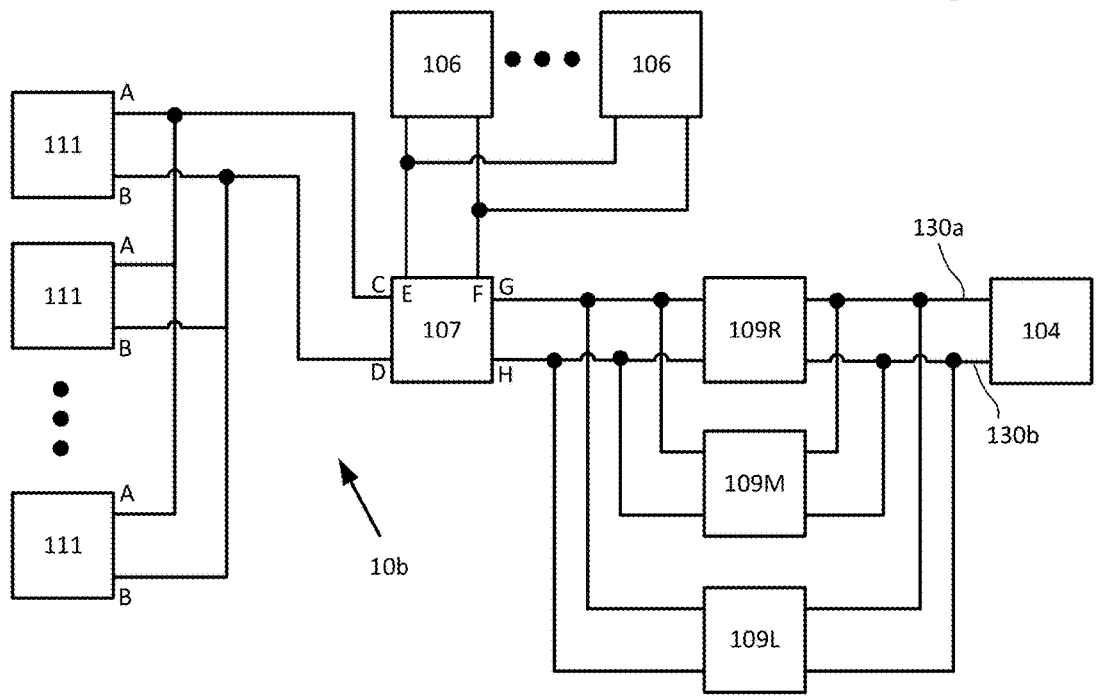
FIG. 1B illustrates a block diagram of a power system, according to one or more illustrative aspects of the disclosure.

Reference is now made to FIG. 1B, which illustrates a block diagram of a power system 10b, according to illustrative aspects of the disclosure. Power system 10b may be similar to power system 10a except with respect to wiring configurations 111. In power system 10b, each wiring configuration 111 may include output terminals A and B. The outputs on terminals A and B of the wiring configurations 111 may be connected in parallel to form a parallel connection of wiring configuration 111 outputs. The parallel connection may be connected to input terminals C and D of a link unit 107.

A feature of link units 107 according to certain aspects may be to include a power device such as power devices 103 (which will be described in FIG. 1C) which may convert power bi-directionally. A first direction of power conversion by a power device may be when multiple storage devices 106 are sourced with converted power from the power devices. Storage devices 106 may receive converted power from the power devices when storage devices 106 are being charged. A second direction of power conversion may be when power from storage devices 106 is converted by the power device to be supplied to loads 104 via system power devices 109. Three system power devices 109R, 109M and 109L may be shown with respective inputs and outputs connected in parallel.

With respect to system power devices 109 which may be DC to AC inverters, a first direction of power conversion by the inverters may be from AC to DC. The first direction may be for when multiple storage devices 106 are sourced with converted power from load 104 which may be an AC utility grid, for example. A second direction of power conversion may be used when power from storage devices 106 is converted by inverters to be supplied to loads 104 via system power devices 109. The second direction of power conversion may also include power from power sources 101 with respective power device 103.

Figure 1C:
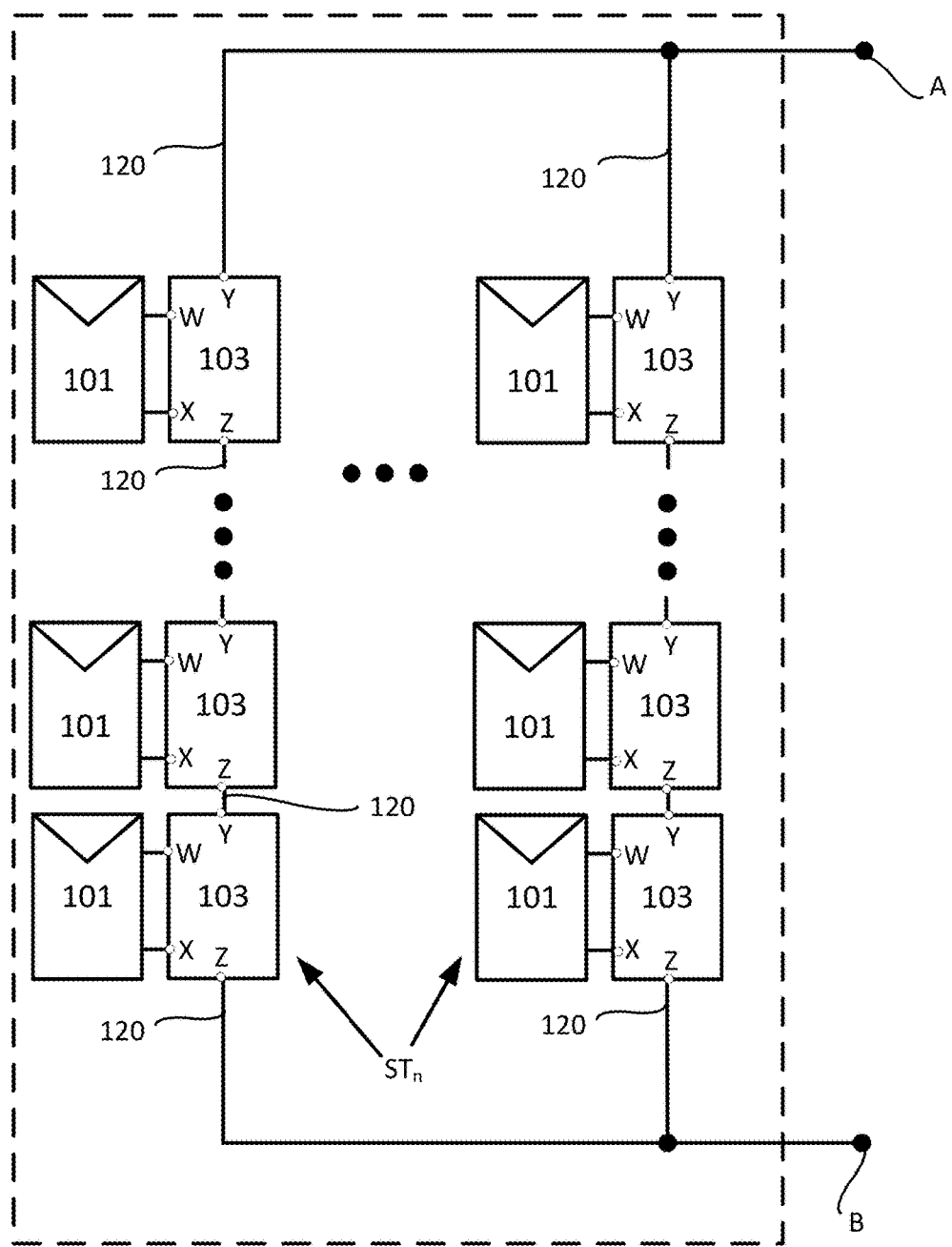
FIG. 1C illustrates details of wiring configurations shown in FIGS. 1A and 1B, according to one or more illustrative aspects of the disclosure.

Reference is now made to FIG. 1C, which illustrates more details of wiring configurations 111 shown in FIGS. 1A and 1B, according to illustrative aspects of the disclosure. Multiple strings $ST_n$ may be shown in a wiring configuration 111 which are connected in parallel at terminals A and B. The output of wiring configuration 111 at terminals A and B may connect to the input of link unit device 107 at terminals C and D. Each wiring configuration 111 may include one or more power sources 101 which may be connected to a respective power device 103 at terminals W and X. The outputs of power devices 103 at terminals Y and Z may be connected together to form a string $ST_n$ which connects across terminals A and B. The connections in string $ST_n$ and optionally additional strings $ST_n$ connected to terminals A and B are provided by power lines 120. Alternatively, strings $ST_n$ may connect in series rather than in parallel as shown and the series connection of strings $ST_n$ may connect across terminals A and B. According to features described above both wiring configurations 111 and power sources 101/power devices 103 contained in a wiring configuration 111 may be connected various series/parallel or parallel series combinations. Power sources 101 may contain different types of power derived from both renewable energy sources such as from sunlight, wind or wave power. Power sources 101 may include non-renewable energy sources such as fuel used to drive turbines or generators, for example.

Figure 1D:
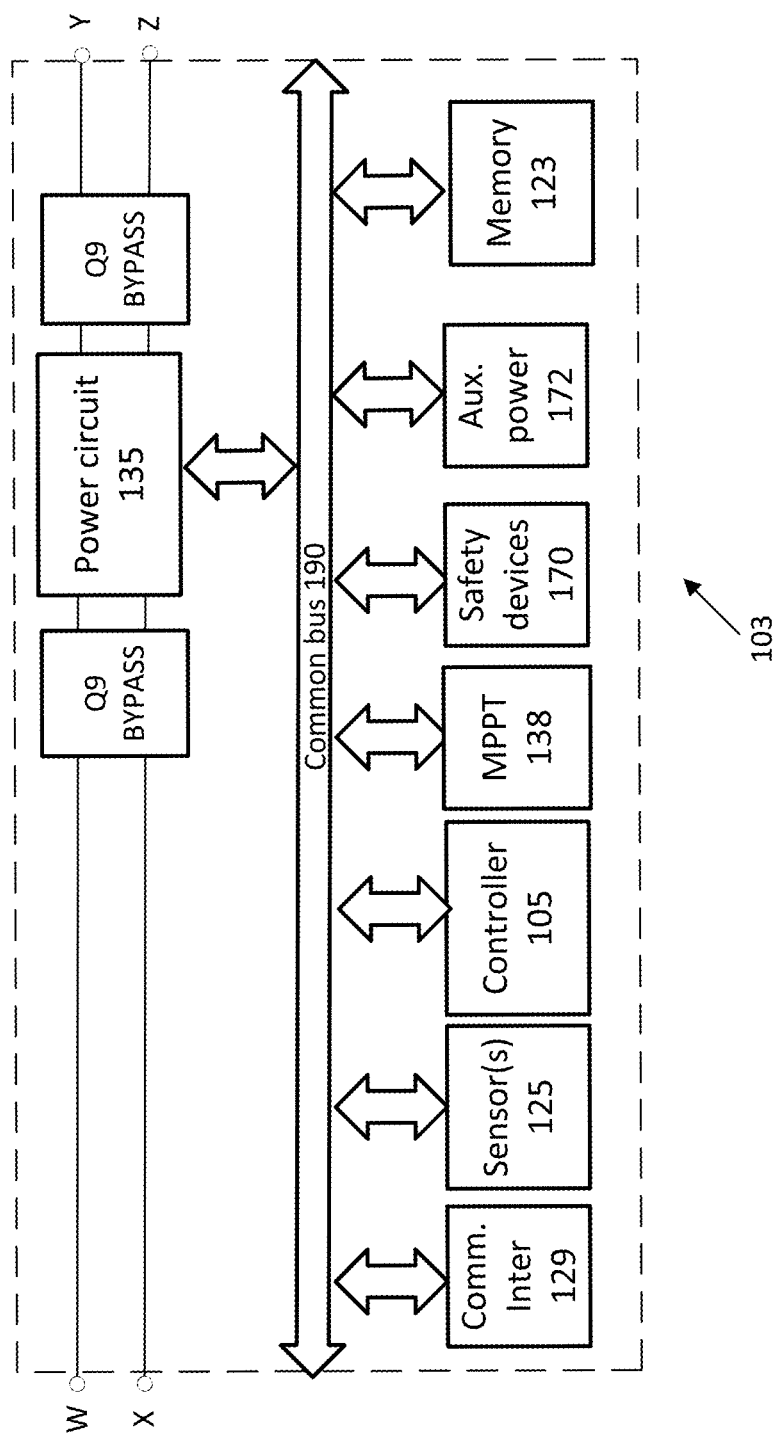
FIG. 1D illustrates circuitry which may be found in a power device, according to one or more illustrative aspects of the disclosure.

Reference is now made to FIG. 1D, which illustrates circuitry which may be found in a power device such as power device 103, according to illustrative aspects of the disclosure. Input and output terminals W, X, Y and Z may provide connection to power lines 120 of FIG. 1C. In some cases, power device 103 may include power circuit 135. Power circuit 135 may include a direct current-direct current (DC/DC) converter such as a Buck, Boost, Buck/Boost, Buck+Boost, Cuk, Flyback and/or forward converter, or a charge pump. In some cases, power circuit 135 may include a direct current-alternating current (DC/AC) converter (also known as an inverter), such as a micro-inverter. Power circuit 135 may have two input terminals and two output terminals, which, according to some aspects of the disclosure, may be the same as the input terminals and output terminals of power device 103. According to illustrative aspects, power device 103 may include Maximum Power Point Tracking (MPPT) circuit 138, configured to extract increased power from a power source.

According to some aspects, power circuit 135 includes MPPT functionality (e.g., power circuit 135 may be operated to draw maximum or increased power from a power source connected to power circuit 135), and a separate MPPT circuit 138 is not used. According to some features, MPPT circuit 138 (or power circuit 135) may implement impedance matching algorithms to extract increased power from a power source. Power device 103 may further include a controller 105 such as an analog control circuit, a microprocessor, Digital Signal Processor (DSP), Application-Specific Integrated Circuit (ASIC) and/or a Field Programmable Gate Array (FPGA).

Still referring to FIG. 1D, controller 105 may control and/or communicate with other elements of power device 103 over common bus 190. According to some features, power device 103 may include circuitry and/or sensors/sensor interfaces 125 configured to measure parameters. Sensors/sensor interfaces 125 may measure directly or receive measured parameters from other connected sensors and/or sensor interfaces 125. The sensors and/or sensor interfaces 125 may be configured to measure parameters on or near power source 101, such as the voltage and/or current output by power source 101 and/or the power output by power source 101. According to some features, power source 101 may be a photovoltaic (PV) generator which includes PV cells. Power sources 101 may also include a sensor or sensor interface which may directly measure or receive measurements of the irradiance received by the PV cells. The sensor or sensor interface may also directly measure or receive the temperature on or near the PV generator.

Still referring to FIG. 1D, according to some features, power device 103 may include communication interface 129, configured to transmit and/or receive data and/or commands from other devices. Communication interface 129 may communicate using Power Line Communication (PLC) technology, acoustic communications technology, or additional technologies such as ZIGBEE™, Wi-Fi, BLU- ETOOTH™, near field communication (NFC), cellular communication or other wireless methods. Power Line Communication (PLC) may be performed over power lines 120 between power devices 103 and link unit (e.g. DC-DC converter and/or inverter) 107 which may include a similar communication interface to communication interface 129.

According to some features, power device 103 may include memory device 123, for logging measurements taken by sensor(s)/sensor interfaces 125, for storing code, operational protocols or other operating information. Memory device 123 may be flash, Electrically Erasable Programmable Read-Only Memory (EEPROM), Random Access Memory (RAM), Solid State Devices (SSD) or other types of appropriate memory devices.

Still referring to FIG. 1D, according to some features, power device 103 may include safety devices 170 (e.g. fuses, circuit breakers and Residual Current Devices (RCD)). Safety devices 170 may be passive or active. For example, safety devices 170 may include one or more passive fuses disposed within power device 103. The element of the fuse may be designed to melt and disintegrate when excess current above the rating of the fuse flows through it. The fuse melting and disintegrating may therefore disconnect part of power device 103, from power lines 120 and/or power sources 101 for example, so as to avoid damage to power device 103. In some cases, safety devices 170 may include active disconnect switches, configured to receive commands from a controller (e.g. controller 105, or an external controller). The commands received may short-circuit and/or disconnect portions of power device 103. The commands received may enable short-circuit and/or disconnect portions of power device 103 in response to a measurement measured by a sensor. The measurement may be obtained by sensors/sensor interfaces 125.

In some cases, power device 103 may include auxiliary power circuit 172. Auxiliary power circuit 172 may be configured so as to receive power from a power source connected to power device 103. Auxiliary power circuit 172 may be configured so as to provide output power suitable for operating other circuitry components (e.g. controller 105, communication interface 129, etc.). Communication, electrical connecting and/or data-sharing between the various components of power device 103 may be carried out over common bus 190. In some cases, auxiliary power circuit 172 may be connected to an output of a power device 103 and designed to receive power from power sources connected to other power devices.

Power device 103 may include or be operatively attached to a maximum power point tracking (MPPT) circuit (e.g. a separate MPPT circuit 138 or implemented as part of power circuit 135). The MPPT circuit may also be operatively connected to controller 105 or another controller 105 included in power device 103 which may be designated as a primary controller. According to some aspects of the disclosure, a primary controller in power device 103 may communicatively control one or more other power devices 103 which may include controllers known as secondary controllers. Once a primary/secondary relationship may be established, a direction of control may be from the primary controller to the secondary controllers. The MPPT circuit under control of a primary and/or central controller 105 may be utilized to increase power extraction from power sources 101 and/or to control voltage. Control of a primary and/or central controller 105 may be utilized to increase current supplied to link unit (e.g. DC-DC converter and/or an inverter or a load) 107. According to some features, no single power device 103 may be designated as a primary controller, and each power device 103 operates (or subgroups of power devices operate) independently. Therefore, each power device 103 may operate without being controlled by a primary controller, or a primary controller may be separate from power devices 103.

Referring still to FIG. 1D, according to some features, power device 103 may include bypass unit Q9 coupled between the inputs of power circuit 135 and/or between the outputs of power circuit 135. Bypass unit Q9 and/or power circuit 135 may be a junction box to terminate power lines 120 or to provide a safety feature such as fuses or residual current devices. Bypass unit Q9 may also be an isolation switch. Bypass unit Q9 may be a passive device, for example, a diode. Bypass unit Q9 may be controlled by controller 105. If an unsafe condition is detected, controller 105 may set bypass unit Q9 to ON, thereby short-circuiting the input and/or output of power circuit 135. In one example, where the pair of power sources 101 may be photovoltaic (PV) generators, each PV generator may provide an open-circuit voltage at its output terminals. In this example, when bypass unit Q9 is ON, the PV generators may be short-circuited, to provide a voltage of about zero to power circuit 135. In both scenarios, a safe voltage may be maintained, and the two scenarios may be staggered to alternate between open-circuiting and short-circuiting PV generators. This mode of operation may allow continuous power supply to system control devices, as well as provide backup mechanisms for maintaining a safe voltage (e.g., operation of bypass unit Q9 may allow continued safe operating conditions).

According to some features, the power device 103 may comprise a partial group of the elements illustrated in FIG. 1D. For example, a power device 103 might not include power circuit 135 (e.g., power circuit 135 may be replaced by a short circuit, and a single bypass unit Q9 may be featured). In a scenario where power circuit 135 may be not present, power device 103 may be still used to provide safety, monitoring and/or bypass features.

Figure 1E:
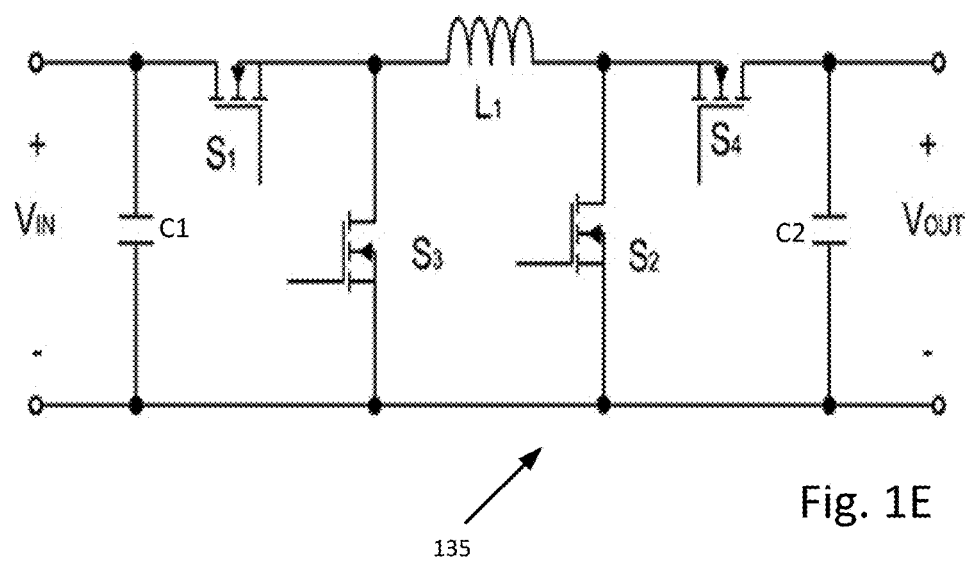
FIG. 1E illustrates a buck+boost circuit implementation for a power circuit, according to one or more illustrative aspects of the disclosure.

Reference is now made to FIG. 1E, which shows a buck+boost circuit implementation for power circuit 135, according to one or more illustrative aspects of the disclosure. The buck+boost circuit implementation for power circuit 135 utilizes metal oxide semi-conductor field effect transistors (MOSFETs) for switches S1, S2, S3 and S4. The sources of switches S1, S2, S3 and S4 may be referred to as first terminals. The drains of S1, S2, S3 and S4 may be referred to as second terminals. The gates of S1, S2, S3 and S4 may be referred to as third terminals. Capacitor C1 may be connected in parallel across the respective positive (+) and negative (−) input terminals of the buck+boost circuit where the voltage may be indicated as $V_{IN}$. Capacitor C2 may be connected in parallel across the respective positive (+) and negative (−) output terminals of the buck+boost circuit where the voltage may be indicated as $V_{OUT}$. First terminals of switches S3 and S2 may connect to the common negative (−) output and input terminals of the buck+boost circuit. A second terminal of switch S1 may connect to the positive (+) input terminal and a first terminal of switch S1 may connect to a second terminal of switch S3. A second terminal of switch S4 may connect to the positive (+) output terminal and a first terminal of switch S4 may connect to the second terminals of switch S2. Inductor L1 may connect respectively between the second terminals of switches S3 and S4. Third terminals of switches S1, S2, S3 and S4 may be operatively connected to controller 105.

Switches S1, S2, S3 and S4 may be implemented using semi-conductor devices, for example, metal oxide semiconductor field effect transistors (MOSFETs), insulated gate bipolar transistors (IGBTs), bipolar junction transistors (BJTs), Darlington transistor, diode, silicon-controlled rectifier (SCR), Diac, Triac or other types of semi-conductor switches. Using by way of example, switches S1, S2, S3 and S4 may be implemented by use of bipolar junction transistors. The collectors, emitters and bases of the bipolar transistors may refer to first terminals, second terminals and third terminals described and defined above. Switches S1, S2, S3 and S4 may be implemented using mechanical switch contacts, such as hand operated switches or electro-mechanically operated switches such as relays. Similarly, power device 103 may include, for example, a buck circuit, a boost circuit, a buck/boost circuit, a Flyback circuit, a Forward circuit, a charge pump, a Cuk converter or any other circuit which may be utilized to convert power on the input of power device 103 to the output of power device 103.

Figure 1F:
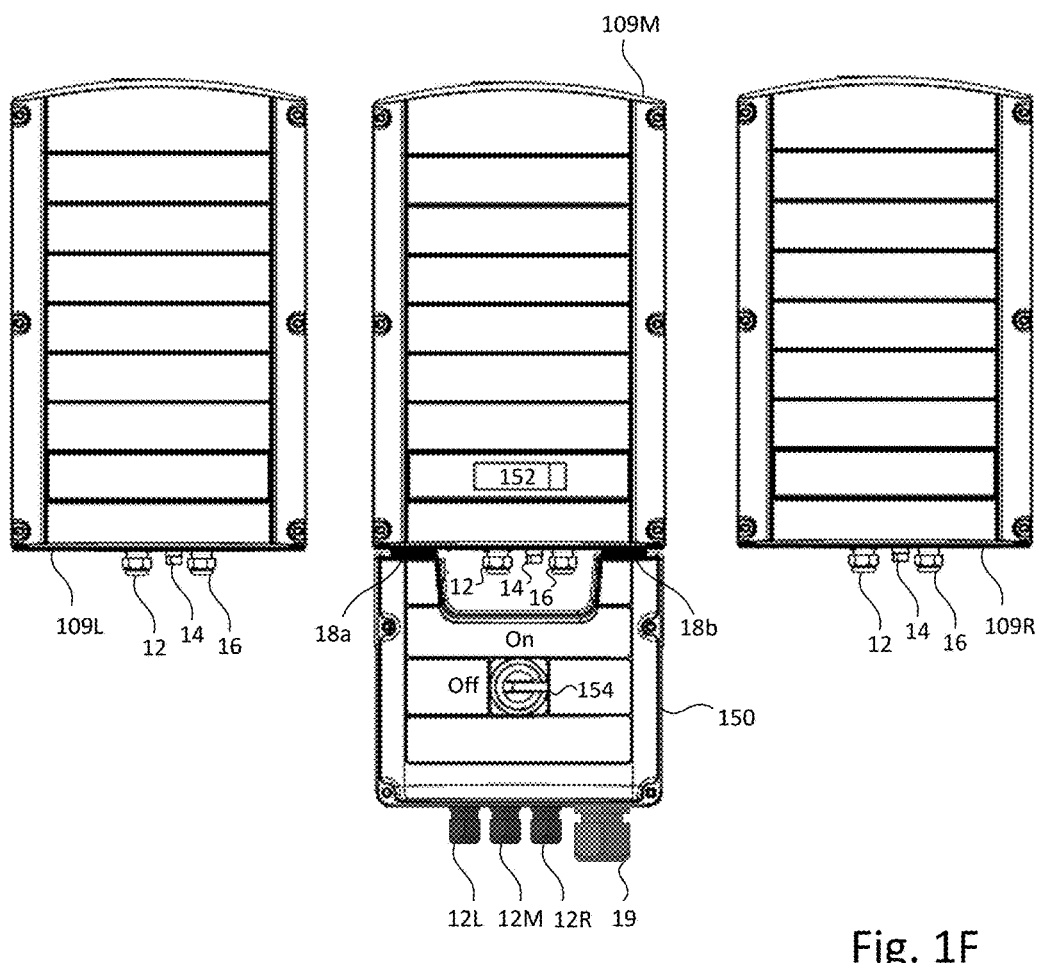
FIG. 1F shows a plan view of a physical layout for three system power converters, according to one or more illustrative aspects of the disclosure.

Reference is now made to FIG. 1F, which shows a plan view of a physical layout for three system power devices 109R, 109M and 109L, according to one or more illustrative aspects of the disclosure. Cables for connection of DC and AC between power devices 109R, 109M, 109L and junction box 150 are not shown. Power devices 109R, 109M and 109L may be mounted to a wall or a frame (both not shown). The mounting may be such that power device 109L is mounted laterally to the left (L) of middle (M) power device 109M and power device 109R is mounted laterally to the right (R) of middle (M) power device 109M. Junction box 150 may be shown attached underneath power device 109M but also may be attached underneath power devices 109R and/or 109L or laterally to the sides of either power devices 109R, 109M or 109L. Alternatively, or in addition, an arrangement of power devices 109 may be such that power device 109L is mounted longitudinally above middle power device 109M and power device 109R is mounted longitudinally below middle power device 109M. As such junction box 150 may be mounted laterally to the left or right of middle power device 109M or to the left or right of power device 109R and/or power device 109L.

Middle (M) power device 109M as with power devices 109L and 109R may include a data connection 14, gland 12 for an AC output cable (not shown) and gland 16 for a DC input from cables (not shown) from link units 107. A cable gland like glands 12, 16 and 19 in descriptions which follow may refer to devices designed to attach and secure the end of an electrical cable to the housings of power devices 109R, 109M and 109L and junction box 150. Middle (M) power device 109M and/or power devices 109L and 109R may also include a display 152 which is shown mounted on the housing of middle (M) power device 109M. Attached to middle (M) power device 109M and/or the wall or the frame is a junction box 150. The attachment of middle (M) power device 109M to junction box 150 may also include conduits 18a and 18b which may provide a mechanical attachment between power device 109M and junction box 150. The mechanical attachment may provide a tube for protecting electrical wiring conductors between device 109M and optional junction box 150. Junction box 150 may also include an isolation switch 154 and glands 12L, 12M, 12R and AC output via gland 19. The isolation switch 154 may be utilized to isolate DC from being applied to the inputs of power devices 109R, 109M and 109L.

By way of example, an installer may attach and secure a DC cable from link units 107 to the housing of power devices 109 via glands 16. The conductors of the DC cable may pass through gland 16 to be terminated inside the power device 109. Specifically, according to one or more illustrative aspects of the disclosure, the DC cable from link units 107 may be attached and secured to the housing of power device 109M via gland 16 of power device 109M. The conductors of the DC cable may then be fed through conduits 18a and/or 18b and terminated into a termination inside junction box 150. From the termination via the isolation switch 154, DC inputs to power devices 109L and 109R may be provided by DC cables secured and attached between glands of junction box 150 and glands 16 of power devices 109L and 109R. The conductors of the DC cable may be terminated in power devices 109L and 109R and the other ends of the conductors terminated in junction box 150 at the termination inside. DC input into power device 109M may be via conductors from the termination via the isolation switch 154 through conduits 18a and/or 18b and terminated in power device 109M. The terminations of DC cables and conductors described above may also be made in additional junction/connection boxes.

In a similar manner, if power devices 109R, 109M and 109L are three phase DC to AC inverters, a three phase AC cable may be attached and secured at both ends of the three phase AC cable. The three phase AC cable may be attached and secured at both ends for example between gland 12 of power device 109L and gland 12L of junction box 150. The conductors of the three phase AC cable may be terminated inside the respective housings of power device 109L and junction box 150. Similarly, a three phase AC cable may be attached and secured at both ends of the three phase AC cable. Both ends of the three phase AC cable may be between gland 12 of power device 109R and gland 12R of junction box 150. The conductors of the three phase AC cable may be terminated inside the respective housings of power device 109R and junction box 150. Similarly, a three phase AC cable may be attached and secured at both ends of the three phase AC cable for example between gland 12 of power device 109M and gland 12M of junction box 150. Alternatively, the three-phase connection between power device 109M and junction box 150 may have conductors pass through conduits 18a and/or 18b. The conductors provide the connection between power device 109 and junction box 150. An AC cable with conductors terminated in junction box 150 may be attached and secured to the housing of junction box 150 by gland 19. The AC cable may provide the AC combined power output of power devices 109R, 109M and 109L which may be connected to load 104.

Figure 1G:
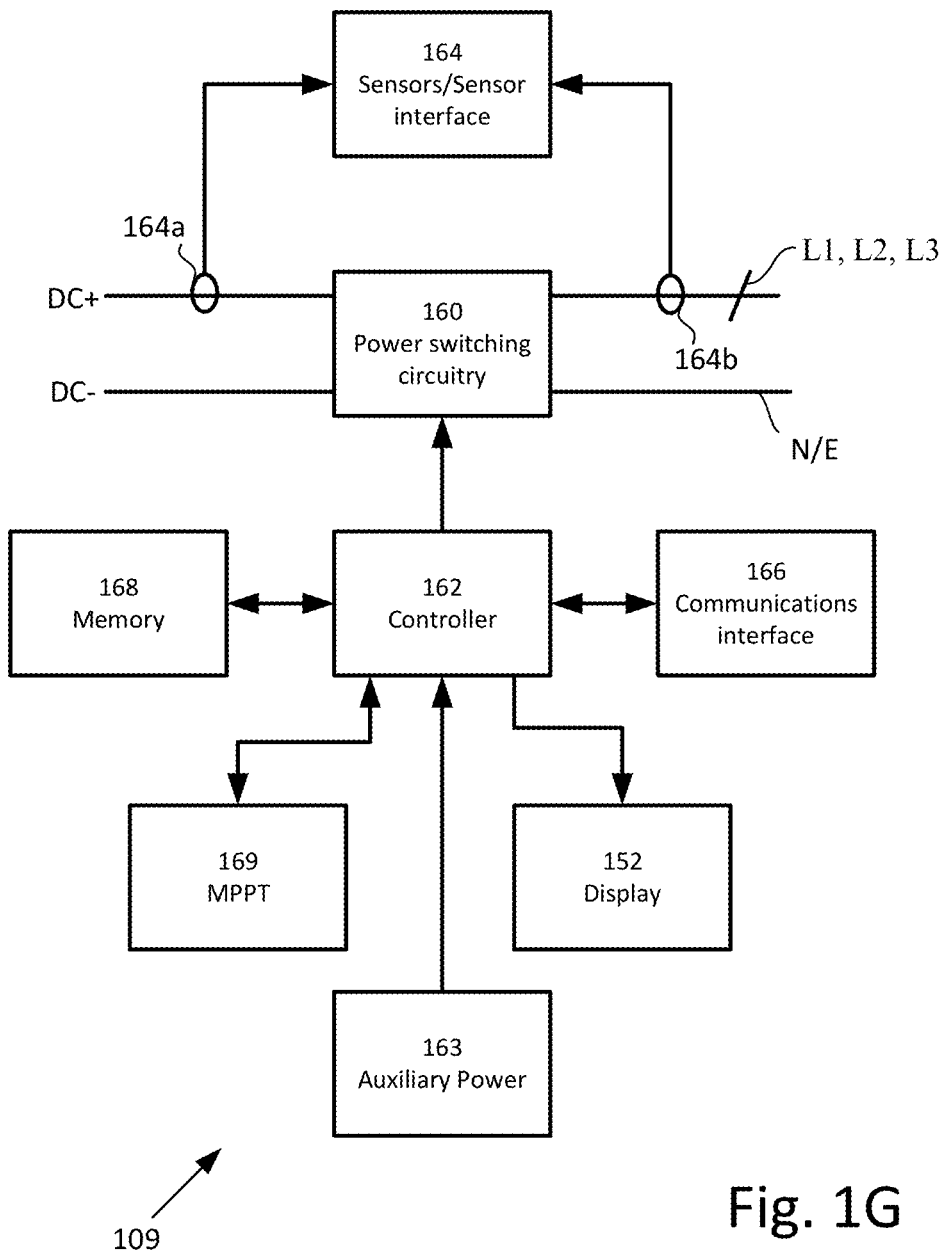
FIG. 1G shows a part system block diagram and part schematic diagram for power converter, according to one or more illustrative aspects of the disclosure.

Reference is now made to FIG. 1G, which shows a part system block diagram and part schematic diagram for power device 109, according to one or more illustrative aspects of the disclosure. Power device 109 may be used to implement power devices 109R, 109M and 109L. As such, power devices 109R and 109L may or may not include display 152 as shown in FIG. 1F for example and/or other components of power device 109. Power device 109M may include all the components of power device 109. Power devices 109L and 109R may include power switching circuitries 160, sensors and/or sensor interfaces 164. Power device 109M provides the other features of power device 109 to power devices 109L and 109R. Alternatively, all the features of power device 109 may be used to implement power devices 109R, 109M and 109L. Controller 162 of power device 109M may serve as a master controller to the other controllers 162 of power devices 109L and 109R. Similarly, the components and functionality of junction box 150 may be integrated into system power device 109. In some locales, safety features included in junction box 150 are not required, and junction box 150 provides power combining circuitry (e.g. by providing connections to AC power outputs of system power devices 109L-109R) without safety devices).

Power device 109 may include a controller 162 which provides an output to control the operation of power switching circuitry 160. Power switching circuitry 160 as a DC to AC inverter may have a DC input applied at terminals DC+ and DC− and a 3-phase output on terminals L1, L2 and L3. Terminals L1, L2 and L3 may include Neutral (N) and earth (E) terminals. Inverter topologies for the DC to AC inverter may include half and full bridge inverters, a diode clamped multilevel inverter, flying capacitors multilevel inverters and/or a cascaded H-bridge multilevel inverters. Sensor interface 164 may be operatively attached to power switching circuitry 160 and to controller 162. Sensor interface 164 may include sensors 164a and 164b and other sensors. Sensors 164a and 164b and the other sensors of sensor interface 164 may provide a sense of electrical parameters such as DC voltage and/or current input on the DC at terminals DC+ and DC. The sense of electrical parameters may include the AC the three phase voltages of the three-phase output on terminals L1, L2 and L3. The sense of electrical parameters may further include phase differences between three phase voltages on terminals L1, L2 and L3, frequencies of three phase voltages on terminals L1, L2 and L3, total harmonic distortion (THD) on three phase voltages on terminals L1, L2 and L3, power factors of three phase voltages on terminals L1, L2 and L3, temperature of heatsinks and/or switching devices utilized in power switching circuitry 160.

Controller 162 may connect bi-directionally to Maximum Power Point Tracking (MPPT) circuit 169. MPPT circuit 169 may be configured to extract increased power from the output of link unit 107 at terminals G and H with respect to FIGS. 1A and 1B for example. MPPT circuit 169 may implement impedance matching algorithms to extract increased power from a power source. Controller 162 may further include a microprocessor/microcontroller, Digital Signal Processor (DSP), Application-Specific Integrated Circuit (ASIC) and/or a Field Programmable Gate Array (FPGA). In some aspects, MPPT circuit 169 may be implemented as part of power switching circuitry 160, or might not be implemented at all (e.g. if MPPT functionality is not needed or desired, for example, if MPPT is applied by a power device connected between the (e.g., DC) input to system power device 109 and a power source.

Controller 162 and the other components of power device 109 may also receive an operating power from auxiliary power circuit 163. The other components of power device 109 may include communication interface 166 and MPPT circuit 169, etc. Controller 162 and the other components of power device 109 may be configured to receive power from a power source connected to link unit 107. In some embodiments, auxiliary power circuit 163 may be designed to receive power from power sources connected to other power devices and power converters, and/or auxiliary power circuit 163 may be designed to receive power from an electric grid.

Controller 162 may include a microprocessor or microcontroller which may be connected bi-directionally to memory 168 and communications interface 166. Communications interface 166 may communicate between power devices 109M, 109L and 109R using power line communication (PLC) technology, acoustic communications technology, or additional technologies such as ZIGBEE™, Wi-Fi, BLUETOOTH™, near field communication (NFC), cellular communication or other wireless methods. Power Line Communication (PLC) may be performed over power lines between power devices 103/power devices 109M, 109L and 109R and link units 107. Communication interface 166 may be a similar communication interface to communication interface 129 as described above. Communication interface 166 may provide communications between power devices 109M, 109L and 109R described below in further detail. Communication interface 166 may provide a connection to a local network and/or a cellular network. The connection may be also to an internet connection to and/or between power devices 103/power devices 109M, 109L and 109R and link units 107. The components of power systems 10a and 10b may include power devices 103/power devices 109M, 109L and 109R and link units 107 for example. The connectability to the local network and/or a cellular network may be remote and/or via a mobile computing device. The mobile computing device may be in the proximity of the components of power systems 10a and 10b which may allow an access to the components. The access may include, for example, updates of firmware to the components, remote and/or local monitoring of each component in power systems 10a and 10b for example. The access may additionally include real time re-configuration of the components responsive to monitored parameters sensed by sensors 125 and sensors/sensor interface 164 of power device 109. The access may help to establish the identity and topographical location of a component relative to other components according to detailed descriptions which follow.

Figure 2A:
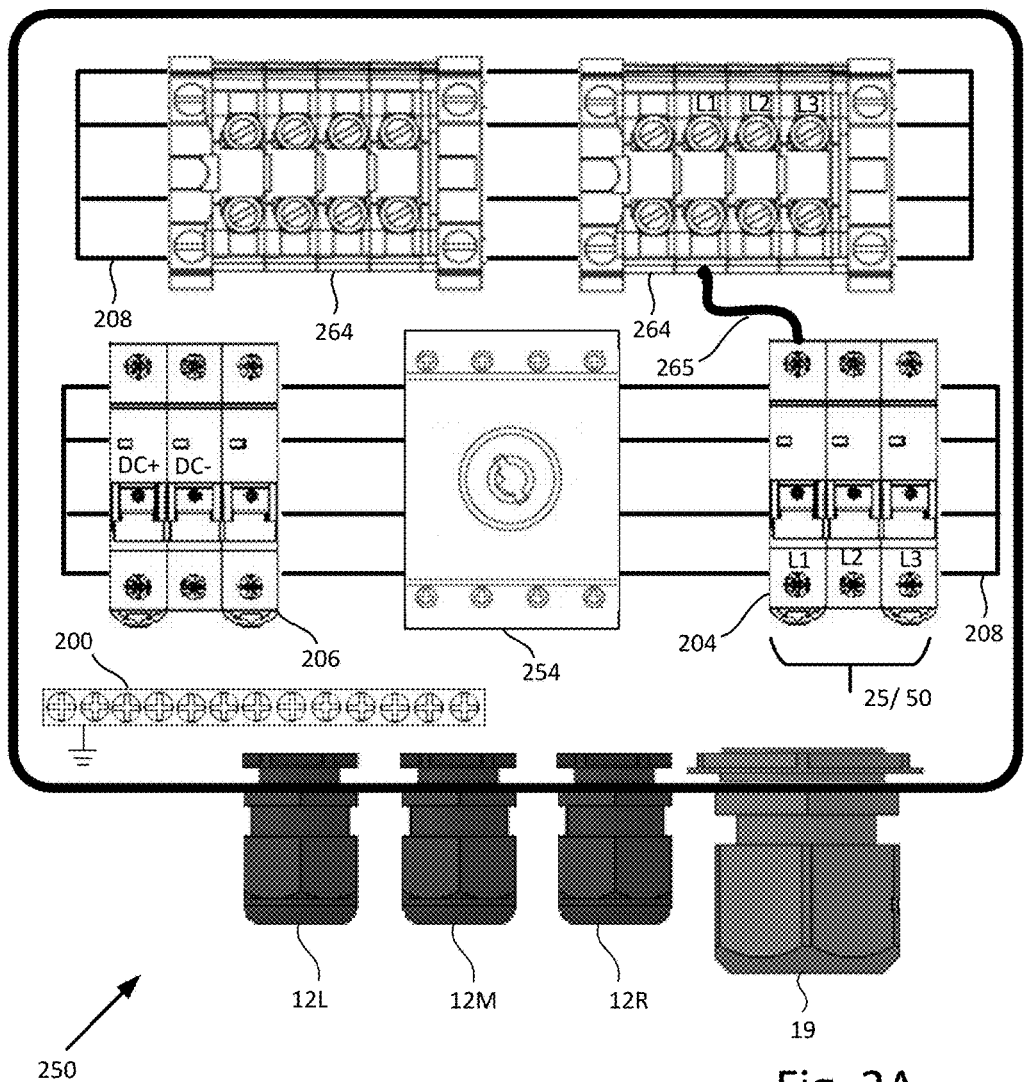
FIG. 2A shows a more detailed view of the inside contents included in a junction box, according to one or more illustrative aspects of the disclosure.

Reference is now made to FIG. 2A, which shows a more detailed view of the inside contents of a junction box 250. The inside contents may include components which connect via cables and/or conduits to power devices 109L, 109M, 109R, according to one or more illustrative aspects of the disclosure. Deutsches Institut für Normung (DIN) rail 208 may be mounted to the back panel of junction box 250. DIN rail 208 may be further utilized to mount DC circuit breakers 206, isolation switch 254 and AC circuit breakers 204. Another DIN rail 208 is shown which shows two terminal blocks 264 which may be utilized to terminate both AC and DC conductors. Further mounted to the back panel of junction box 250 may be ground terminal 200 which may connect electrically to DIN rail 208. According to some aspects, ground terminal 200 may connect to the earth (E) of AC circuit breaker 204, and according to some aspects, ground terminal 200 may connect to a separate earth terminal, or might not be connected to any earth terminal (e.g., where the DC power input to junction box 250 is "floating" with respect to the AC output of junction box 250). As such, the housings of junction box 250 and/or power devices 109R, 109M and 109L may conform to the standard of a Class II or double insulated housing. An example of the Class II or double insulated housing may be according to International Standard IEC 61140 or Standard BSI BS 2754; Memorandum: "Construction of Electrical Equipment for Protection Against Electric Shock"). With respect to junction box 250, compliance of the housings to Class II may provide for the option of not having an electrical connection between ground terminal 200 and electrical earth (E). Similar safety consideration with respect Class II may also apply to the housings of other component parts included in power systems 10a and 10b such as link units 107, storage devices 106 and wiring configurations 111 for example.

Additional terminal blocks 264 may also be mounted on DIN rail 208 and/or the back panel/sides of junction box 250. The additional terminal blocks 264 may be added in order to expand the terminals provided by DC circuit breakers 206, isolation switch 254 and AC circuit breakers 204. Wire 265 connects terminal blocks 264 to AC circuit breakers 204. DC conductors DC+ and DC− from a cable attached and secured to a link unit 107 for example are shown coming through a conduit and terminated in the input of isolation switch 254. The other end of the cable may be secured and attached to power device 109M by gland 16 of power device 109M. The output of isolation switches 254 may be terminated on the DC+ and DC− input of DC circuit breakers 206.

The AC three phase power output of power device 109M may be via conductors live L1, live L2, live L3, neutral N and Earth (E) through conduit 18b and may be terminated in corresponding terminals of AC circuit breaker 204. Alternatively, The AC three phase power output of power device 109M may be connected by an AC three phase cable between gland 12 of power device 109M and gland 12M of junction box 250. The conductors of the AC three phase cable may be terminated respectively in terminals L1, L2, L3, neutral (N) and Earth (E) terminals of power device 109M and in corresponding input terminals of AC circuit breaker 204. The AC three phase power output of power device 109L may be connected by an AC three phase cable between gland 12 of power device 109L and gland 12L of junction box 250. Similarly, The AC three phase power output of power device 109R may be connected by an AC three phase cable between gland 12 of power device 109R and gland 12R of junction box 250. The output of AC circuit breaker 204 may therefore provide the AC combined power outputs of power devices 109R, 109M and 109L. The output of AC circuit breaker 204 may be connected to load 104 via a three-phase cable secured and attached to the housing of junction box 250 by gland 19.

One advantage of AC combined power outputs of power devices 109R, 109M and 109L and the mounting of 109R, 109M and 109L onto a frame and/or a wall may be to aid in the installation by a single operative. In contrast, a single power device 109, which provides the same combined AC power output as power devices 109R, 109M and 109L, may be bulker and/or heavier. Thus the single power device may require multiple operatives and/or additional lifting equipment to mount the single power device 109 on onto a frame and/or a wall. Another benefit of having modular inverters provides flexibility in increasing or reducing the size of a photovoltaic PV installation by simplifying and reducing the work in adding or removing inverters. As yet another advantage, having multiple modular inverters provides an increased level of reliability. Many photovoltaic PV installations may be operated at less than peak-production capacity for significant periods of time. In case a single system power device (e.g., inverter) malfunctions, the other two system power devices may continue to operate. The other two system power devices may provide at least two-thirds (and potentially more, depending on current system generation capacity) of the power otherwise provided by the three system power devices.

Figure 2B:
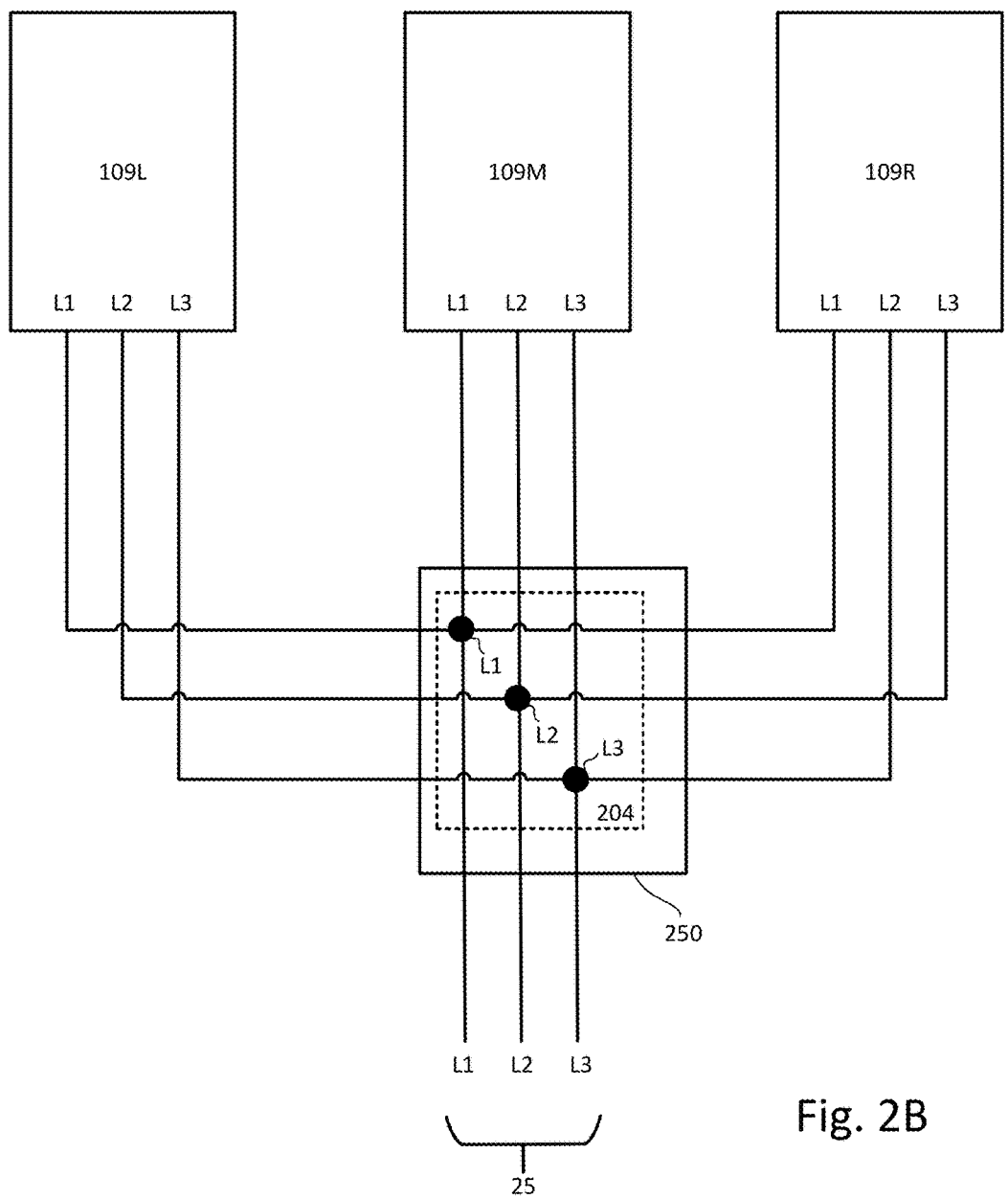
FIG. 2B shows a more detailed view of the AC three phase connections made in a junction box, according to one or more illustrative aspects of the disclosure.

Reference is now made to FIG. 2B, which shows a more detailed view of the AC three phase connections made in junction box 250, according to one or more illustrative aspects of the disclosure. Power device 109L may be mounted/positioned laterally to the left (L) of middle (M) power device 109M and power device 109R may be mounted/positioned laterally to the right (R) of middle (M) power device 109M. Each power device 109R, 109M and 109L has a three-phase output on terminals L1, L2 and L3. Connections between the three-phase output on terminals L1, L2 and L3 of each power device 109R, 109M and 109L and junction box 250 may be by AC three-phase cables as described above with respect to the descriptions of FIG. 1F.

As mentioned previously (with respect to FIG. 2A), additional terminal blocks 264 may also be mounted on DIN rail 208 and/or the back panel/sides of junction box 250. The additional terminal blocks 264 may be added in order to expand the terminals provided by DC circuit breakers 206, isolation switch 254 and/or AC circuit breakers 204. In the case where terminal blocks 264 are provided to connect AC output terminals of multiple inverters (e.g. system power devices 109L-109R), the additional terminal block may enable the swapping of the phases of the conductors terminated in additional terminal blocks 264. As such, the conductors of the AC three phase cables may be terminated at one end in respective terminals L1, L2 and L3 of each power device 109R, 109M and 109L. The other ends of the AC three phase cables conductors may be terminated in terminals labelled as L1, L2 and L3 provided in junction box 250.

The three-phase output 25 (conductors L1, L2, L3, and not shown N) from the other side of AC circuit breakers 204 of junction box 250 may be provided via an AC three phase cable. The AC three phase cable may be attached and secured to the housing of junction box 250 by gland 19.

The AC three phase cables conductors may be terminated in terminals L1, L2 and L3 of AC circuit breakers 204. By virtue of the additional terminal blocks 264 it may be such that L1 conductors of power devices 109R, 109M and 109L connect to the L1 terminal of AC circuit breakers 204; L2 conductors of power devices 109L and 109M connect to the L2 terminal of AC circuit breakers 204 but L3 conductor of power device 109R connects to the L2 terminal of AC circuit breakers 204; L3 conductors of power devices 109L and 109M connect to the L3 terminal of AC circuit breakers 204 but L2 conductor of power device 109R connects to the L3 terminal of AC circuit breakers 204.

Figure 2C:
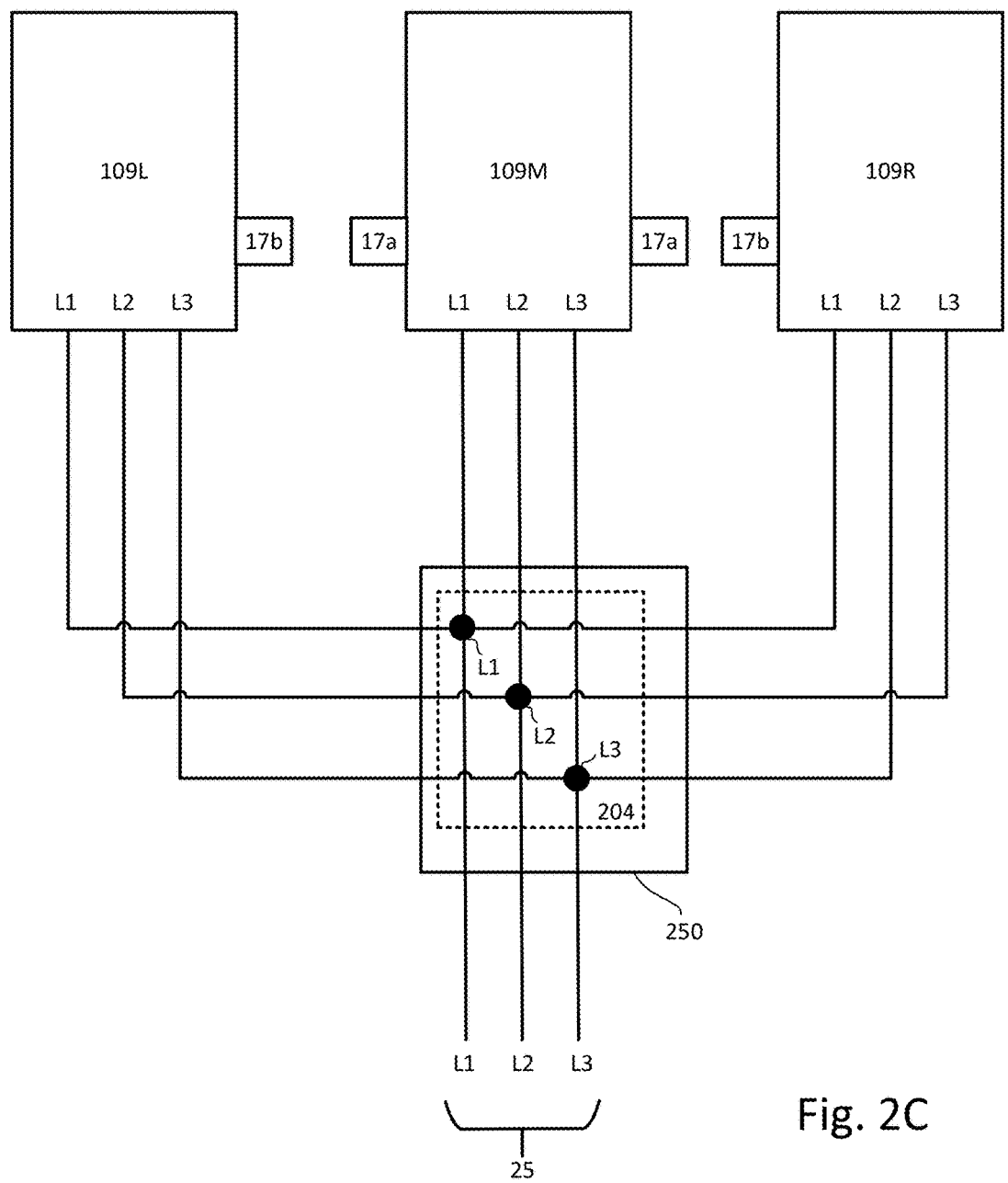
FIG. 2C shows a more detailed view of the AC three phase connections made in a junction box, according to one or more illustrative aspects of the disclosure.

Reference is now made to FIG. 2C, which shows a more detailed view of the AC three phase connections made in junction box 250, according to one or more illustrative aspects of the disclosure. FIG. 2C shows the same connections with respect to AC circuit breakers 204 described above but further includes proximity sensors 17a and respective targets 17b.

Proximity sensors 17a may be configurable to detect the presence of nearby power device 109. For example, two proximity sensors 17a of power device 109M may be utilized to provide a detection of power devices 109L and 109R. The detection may be by virtue of proximity sensor to provide a transceiver function. The transceiver function may be such that a reflected signal form target 17a for a signal sent by proximity sensor 17a may be received by proximity sensor 17a. Targets 17b may be passive or active RFID tags for example or may include along with proximity sensor 17a a near field communication (NFC). The NFC may be a short-range wireless connectivity standard that uses magnetic field induction to enable communication between power devices 109 when they are touched together, or brought within a few centimeters of each other. Other alternatives for proximity sensors 17a and targets 17b may include capacitive proximity sensor types such as capacitive displacement sensors, doppler effect (sensor based on effect), eddy-current, inductive, magnetic, including magnetic proximity fuse. Optical sensors may include optical photocells (reflective), laser rangefinder, passive (such as charge-coupled devices) passive thermal infrared. Other types of sensor may further include radar, reflection of ionizing radiation, sonar (typically active or passive), ultrasonic sensor (sonar which runs in air), fiber optics sensor and/or Hall effect sensor.

Proximity sensors 17a and targets 17b may be located on a surface of the housings of power devices 109L, 109M and 109R, embedded in the surface or inside of the housings of power devices 109L, 109M and 109R. In descriptions that follow proximity sensors 17a and targets 17b may be utilized to obtain and verify the lateral positions left (L) and right (R) of respective power devices 109L and 109R relative to middle (M) power device 109M. Obtaining and verifying the lateral positions may enable monitoring for theft or un-authorized replacement and/or repositioning of power devices 109L, 109M or 109R.

Figure 2D:
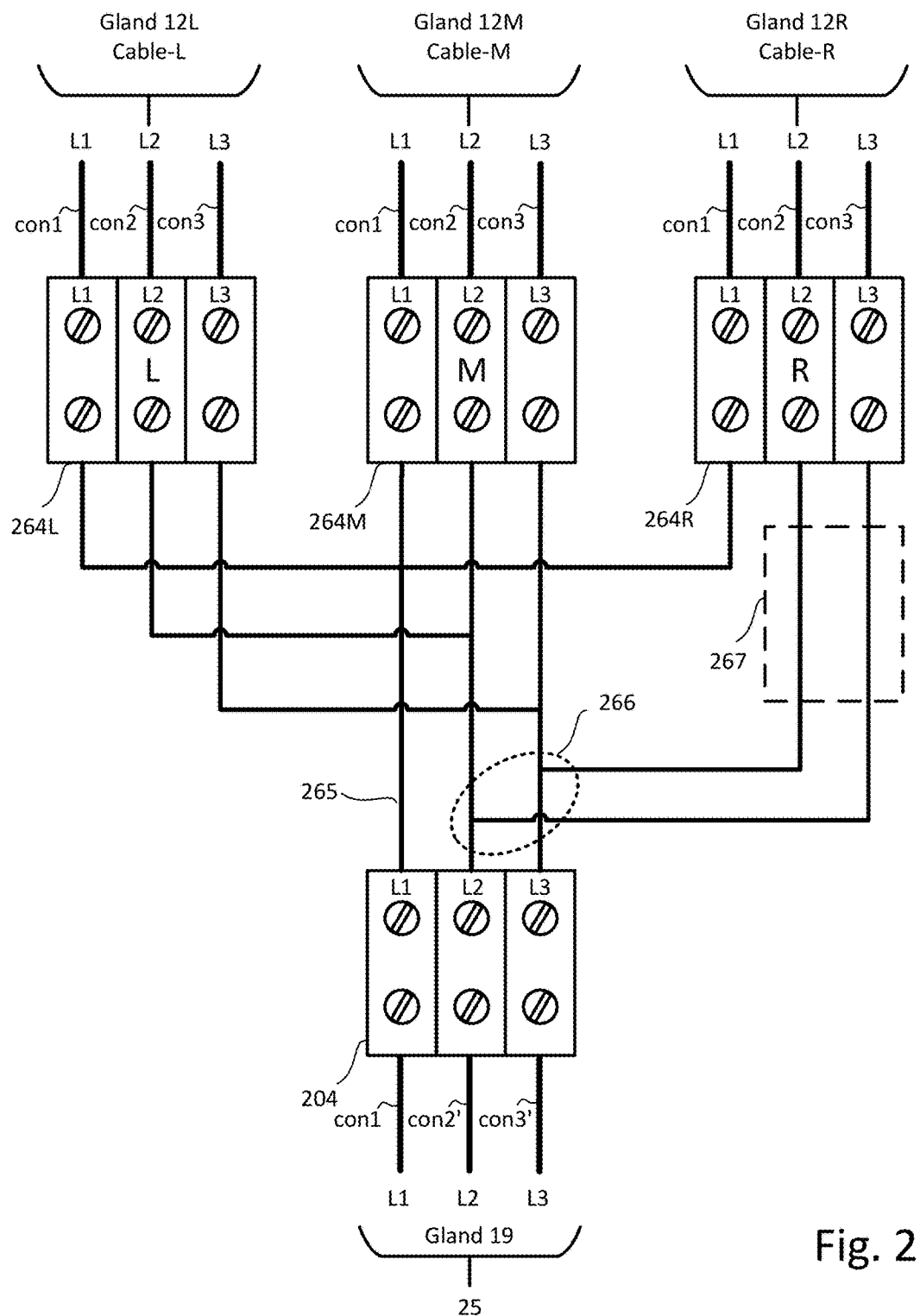
FIG. 2D shows example connections made in a junction box, according to one or more illustrative aspects of the disclosure.

Reference is now made to FIG. 2D, which shows a more details of connections which may be made in junction box 150/250, according to one or more illustrative aspects of the disclosure. As stated above and in descriptions which follow, additional terminal blocks 264 may be added in order to expand the terminals provided by AC circuit breakers 204. Three terminal blocks 264L, 264M and 264R are shown labelled left (L), middle (M) and right (R) which may be mounted on DIN rail 208 (not shown). Cable-L connects electrically power device 109L to terminal block 264L, cable-M connects electrically power device 109M to terminal block 264M and cable-R connects electrically power device 109R to terminal block 264R. Glands 12L, 12M and 12R (not shown) may mechanically and/or electrically attach cable-L, cable-M and cable-R to junction box 150/250. Electrical attachment with respect to glands 12L, 12M and 12R may be with respect to wire armour/shielding of cable-L, cable-M and cable-R. Each of cable-L, cable-M and cable-R includes conductors con1, con2 and con3 which may provide phase L1, L2 and L3 respectively. Conductors con1, con2 and con3 may be labelled L1, L2 and L3 and/or have respective insulation colors red (R), yellow (Y) and blue (B). Each of cable-L, cable-M and cable-R may further include neutral (N) and earth (E) conductors (not shown).

Power device 109L may be located laterally to the left of power device 109M. A parallel connection in junction box 150/250 at terminal blocks 264L, 264M and 264R includes cable-L electrically and mechanically connecting power device 109L to power device 109M. Similarly, power device 109R may be located laterally to the right of power device 109M and the parallel connection includes cable-R electrically and mechanically connecting power device 109R to power device 109M. Further included in the parallel connection is cable-M which connects power device 109M to power devices 109R and 109L. A feature of the parallel connection made at terminal blocks 264L, 264M and 264R is that both electrically and in terms of labeling, phase L1 of power device 109L terminated in terminal block 264L is substantially the same as both phases L1 of power devices 109M and 109R terminated in respective terminal blocks 264M and 264R. Similarly, phase L2 of power device 109L terminated in terminal block 264L is substantially the same as both phases L2 of power devices 109M and 109R terminated in respective terminal blocks 264M and 264R. Similarly phase L3 of power device 109L terminated in terminal block 264L is substantially the same as both phases L3 of power devices 109M and 109R terminated in respective terminal blocks 264M and 264R.

Connection between terminal blocks 264L, 264M, 264R and AC circuit breaker 204 is by wires 256 (as shown partially in FIG. 2A). Connection between terminal blocks 264L, 264M, 264R and AC circuit breaker 204 may include connection of terminals L1 of terminal blocks 264L, 264M and 264R connected together and to terminal L1 of AC circuit breaker 204. Therefore, terminals and label L1 and cable con1 of AC circuit breaker 204 are the same as phases L1 of terminal blocks 264L, 264M and 264R. Terminals L2 of terminal blocks 264L and 264M are connected together and further connected to terminal L2 of AC circuit breaker 204. Connection 266 in AC circuit breaker 204 provides a swap and connection of phases L2 and L3 of terminal block 264R, therefore the three-phase output 25 via gland 19, provides phases L1, L2 and L3 on respective conductors con1, con2' and con3' of an AC output cable (not shown) terminated in AC breaker 204 on terminals labeled respectively as L1, L2 and L3. Connection 266 in AC circuit breaker 204, therefore, provides the swap and connection of phases L2 and L3 of terminal block 264R. The labelling on the three-phase output 25 means that Phase L1 is the same phase, label, terminal throughout junction box 150/250. However, phases/terminals/labels of L2 and L3 on three-phase output 25 are not the same as phases/terminals/labels of L2 and L3 of terminal block 264R since connection 266 in AC circuit breaker 204 provides the swap and connection of phases L2 and L3 of terminal block 264R.

A phase swap relay 267 (shown by dotted box) may be utilized to swap phases L2 and L3. In a first switch state of phase swap relay 267, terminals/labels/phases L1, L2 and L3 are substantially the same on terminal blocks 264L, 264M, 264R and AC circuit breaker 204. However, a second switch state of phase swap relay 267, may provide the swap of phases L2 and L3 of terminal block 264R according to connection 266 in AC circuit breaker 204 in the description described above. The description above and ones below swaps phases L2 and L3, however, swaps may be between phases L1 and L3 or between phases L1 and L2.

Figure 3:
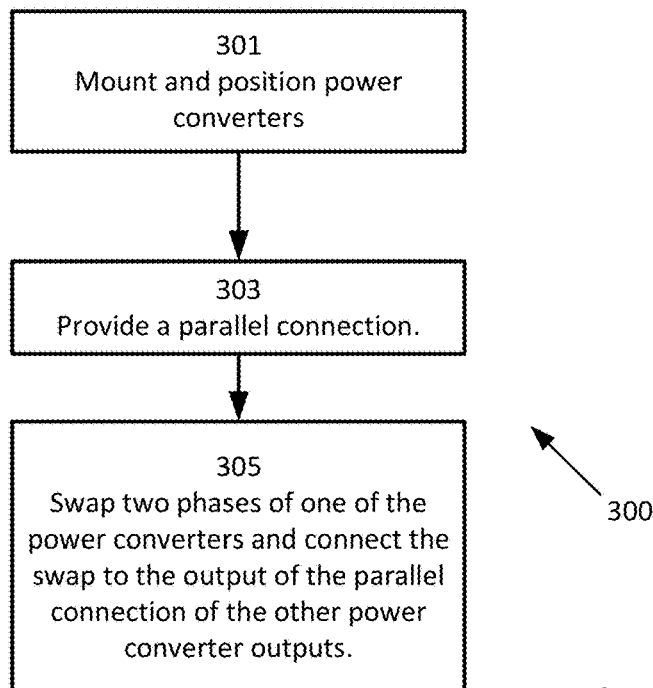
FIG. 3 shows a flowchart of a method, according to one or more illustrative aspects of the disclosure.

Reference is now made to FIG. 3, which shows a flowchart of a method 300, according to one or more illustrative aspects of the disclosure. At step 301, referring back to FIGS. 1F, 2B, 2C and 2D, an installer may mount power devices 109R, 109M and 109L to a wall or a frame (both not shown) such that power device 109L is mounted laterally to the left (L) of middle (M) power device 109M and power device 109R is mounted laterally to the right (R) of middle (M) power device 109M.

At step 303, a parallel connection may be provided which may include the termination of the AC three phase cables conductors inside power devices 109R, 109M and 109L and junction box 250 by an installer. Whereas, the feature of swapping two of the phases may already be provided in junction box 250 supplied to an installer. The parallel connection may be by the installer using a wiring diagram so that the parallel connection may be as described in FIGS. 2B, 2C and 2D. The parallel connection may include a parallel connection of the DC+ and DC− connection of the inputs of power devices 109R, 109M and 109L and/or a parallel connection of the AC outputs of power devices 109R, 109M and 109L.

The wiring diagram may be a simple visual representation of the physical connections such as cables terminations and physical layout which may include the components of power devices 109R, 109M, 109L and junction box 250. The wiring diagram may also show how the electrical wires or conductors are interconnected inside power devices 109R, 109M, 109L as they relate to the components of junction box 250. The components of junction box 250 may include DC circuit breakers 206, isolation switch 254, terminal blocks 264 and AC circuit breakers 204 shown in FIG. 2A for example. Conductors of AC cables may be labelled as L1, L2 and L3 or may color coded such that L1, L2 and L3 correspond respectively red, yellow and blue for example.

With respect to the AC three phase cables conductors terminated in terminals L1, L2 and L3 of junction box 250 as described above, interconnection features of junction box 250 at step 305 may terminate the AC cable between power device 109R and the terminals of AC circuit breakers 204. Termination of the AC cable may be such that conductors L2 and L3 of the cable are terminated in respective terminals L3 and L2 of AC circuit breakers 204. In other words, terminals provided by AC circuit breakers 204 labelled as phases L2 and L3 swap respective phases L3 and L2 of the conductors of the cable. For example, the L1 conductor of junction box 250 may be connected to the L1 terminal of each of system power devices 109L-109R. The L2 conductor of junction box 250 may be connected to the L2 terminal of system power devices 109L and 109M, but to the L3 terminal of system power device 109R. The L3 conductor of junction box 250 may be connected to the L3 terminal of system power devices 109L and 109M, but to the L2 terminal of system power device 109R. Arranging the phase connections in this manner may provide certain benefits, as will be described below.

Figure 4A:
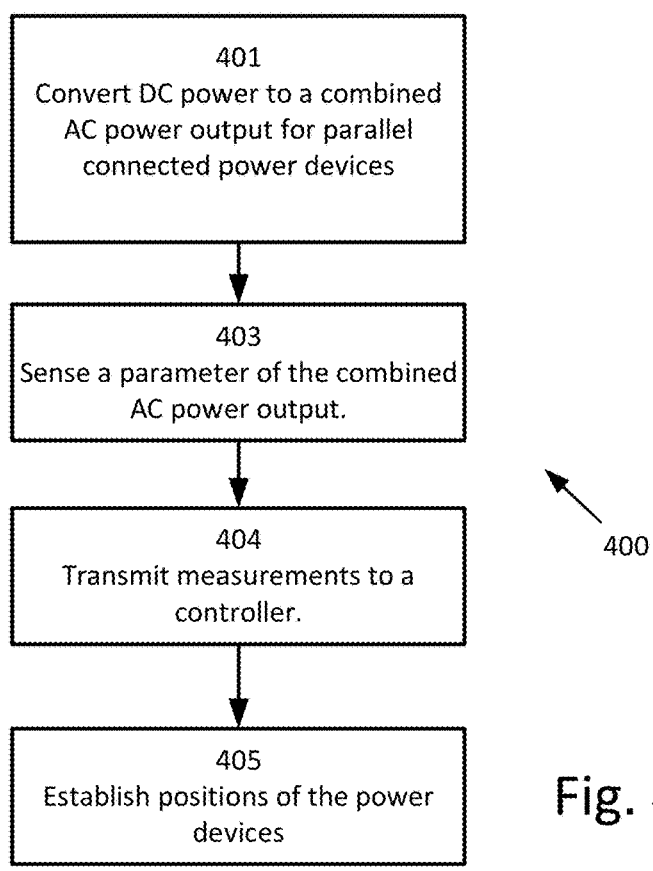
FIG. 4A shows a flowchart of a method, according to one or more illustrative aspects of the disclosure.

Reference is now made to FIG. 4A, which shows a flowchart of a method 400, according to one or more illustrative aspects of the disclosure. Method 400 describes the operation of a parallel connection of power devices 109L, 109M and 109R where the respective DC inputs of power devices 109L, 109M and 109R are connected together and the respective three phase AC outputs of power devices 109L, 109M and 109R are connected together. Method 400 may be carried out by multiple controllers. The combined DC input to power devices 109L, 109M and 109R from link units 107 may be terminated at terminals DC+ and DC− of DC circuit breakers 206 for example. The combined DC input may pass through DC circuit breakers 206 and isolation switch 254 and into the parallel connected DC input of power devices 109L, 109M and 109R. At step 401, using by way of example a total DC input power of 99 Kilo Watt (KW) into the parallel connected DC input to power devices 109L, 109M and 109R.

In some cases, the DC inputs of power devices 109L, 109M and 109R are not connected together. According to different aspects of the disclosure herein, each of power devices 109L-109R might be connected to a separate DC power source (e.g. a photovoltaic generator or a battery) with the AC outputs of power devices 109L-109R combined in parallel.

As a numerical example, each power device 109L, 109M and 109R may convert 33 KW of DC power input to a 33 KW three phase AC output from each power device 109L, 109M and 109R. A combined three phase AC output of substantially 99 KW provided on terminals L1, L2 and L3 of AC circuit breakers 204 may be provided by virtue of the parallel connection of the respective three phase AC outputs of power devices 109L, 109M and 109R.

A parameter such as phase difference between phases L1, L2 and L3 may be sensed at the by sensor 164b/sensor interface 164 of power device 109M at step 403. By virtue of phases L2 and L3 being previously swapped in junction box 250 at step 305, of method 300, different parameters may be measured at the power devices. The results of sensing step 403 may be shown in Table 1 below:

TABLE 1

| Power converter | L1-L2 Phase difference | L1-L3 Phase difference | Sign (L1-L2) |
|---|---|---|---|
| 109L | 120 | −120 | 1 |
| 109M | 120 | −120 | 1 |
| 109R | −120 | 120 | −1 |

Or by Table 2 below:

TABLE 2

| Power converter | L1-L2 Phase difference | L1-L3 Phase difference | Sign (L1-L2) |
|---|---|---|---|
| 109L | −120 | 120 | −1 |
| 109M | −120 | 120 | −1 |
| 109R | 120 | −120 | 1 |

From the above two tables, it can be seen that the right (R) power device 109R always has an opposite Sign (L1-L2) with respect to the other two power devices 109M and 109L. As such, in step 405, the lateral positions left (L) and right (R) of respective power devices 109L and 109R relative to middle (M) power device 109M can be obtained. The lateral position obtained for example may be by remote monitoring techniques where communications interfaces 166 may be connectable to a local network and/or a cellular network. The connection to a local network and/or a cellular network may be in order to establish an internet connection to and/or between power devices 103/power devices 109M, 109L and 109R and link units 107 for example.

At step 404, a sensed parameter (e.g. phase difference) sensed by each system power device 109 may be transmitted to a central controller. The sensed parameter may also be the phase sequence of the phases. The phase sequence may be defined as the order in which the three phase voltages (L1, L2 and L3 or respectively red (R), yellow (Y) and blue (B)) attain their positive peak values. The phase sequence is said to be RYB if R phase attains its peak or maximum value first followed by Y phase 120° later and B phase 240° later than the R phase. The phase sequence is said to be RBY if R phase is followed by B phase 120° later and Y phase 240° (or −120°) later than the R phase. By convention RYB may be considered as positive while the sequence RBY may be considered as negative.

Based on the sensed parameters, at step 405, the central controller may establish the positions of the power devices. According to some aspects of the disclosure, each system power device may, based on the measurements, establish its (i.e., the instant system power device's) position and transmit the established position to the central controller. Step 405 may additionally consider the serial number of power device 109M in order to verify the lateral positions left (L) and right (R) of respective power devices 109L and 109R relative to middle (M) power device 109M. Alternatively, the phase differences in conjunction as summarized in Tables 1 and 2 above and/or with the use of proximity sensors 17a and respective targets 17b may be used to obtain and verify the lateral positions left (L) and right (R) of respective power devices 109L and 109R relative to middle (M) power device 109M.

The arrangement of FIG. 2C and the resultant Tables 1-2 are illustrative. According to features herein, phases L2 and L3 may be swapped with respect to power device 109L or 109M, or instead of swapping phases L2 and L3, phases L1 and L2 may be swapped.

Figure 4B:
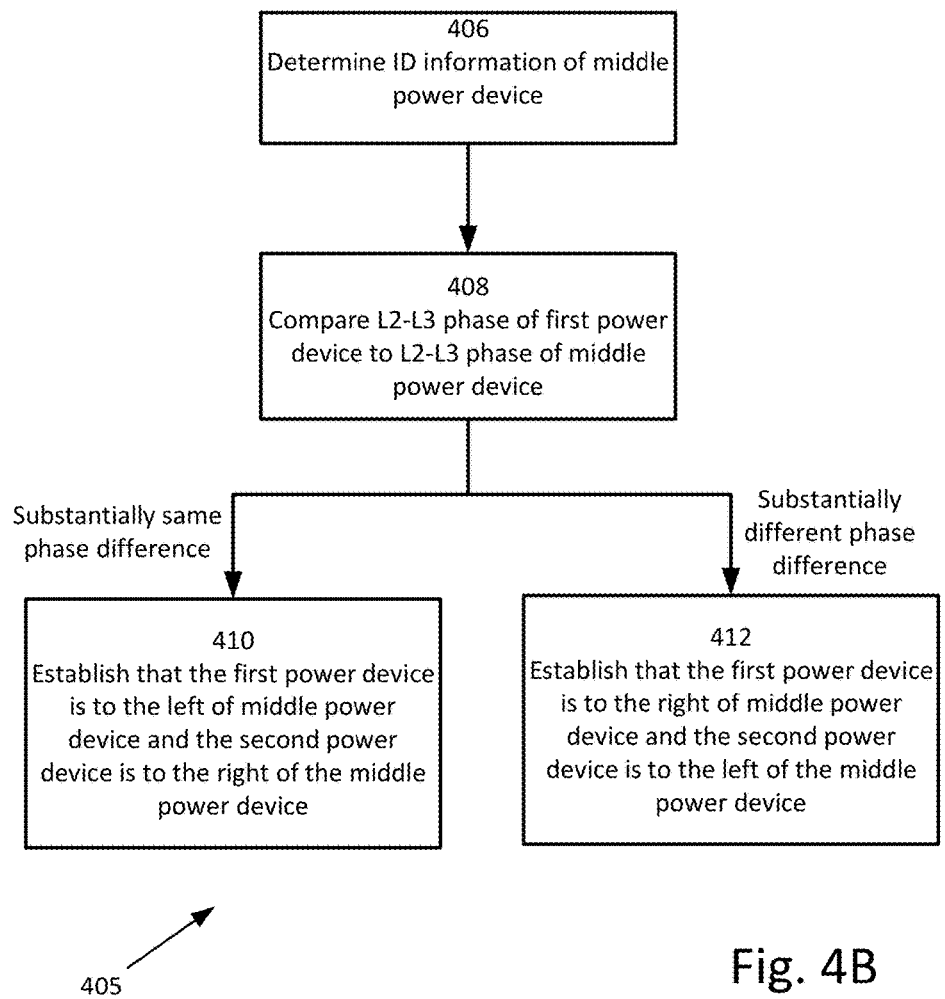
FIG. 4B shows an implementation of step 405 as shown in FIG. 4A, according to one or more illustrative aspects of the disclosure.

Reference is now made to FIG. 4B, which shows an implementation of step 405 of method 400, according to illustrative features. At step 406, given identifying information of the system power devices (e.g. serial numbers, ID tags etc.), the identifying information of the middle system power device 109M may be determined, for example, by being unique compared to the other two system power device identifying information. For example, by virtue of being connected or connectable to a junction box 250, a system power device 109M may have a serial number similar to MPCxxxxx (where each 'x' is replaced by a number) and system power devices 109L and 109R may have serial numbers similar to SPCxxxxx. System power devices 109L and 109R may be generic, e.g., during manufacturing a position (right or left) with regard to a middle system power device which might not be predetermined.

At step 408, the device carrying out step 405 (e.g., the central controller) may compare the phase difference between phases L2 and L3 of the first power device to the phase difference between phases L2 and L3 of the middle power device as determined at step 406. Each power device of the middle, first and second power devices may calculate the L2-L3 phase difference by comparing the time elapsed between reaching the peak of the sine wave generated at phase L2 and reaching the peak of the sine wave generated at phase L3. For example, in a system where power devices generate 3-phase 50 Hz sine waves if a power device determines that about 6.67 milliseconds elapse between phase L2 reaching a peak and phase L3 reaching a peak, the power device may determine that a 120-degree phase shift $$\frac{1}{50\ Hz \cdot 3} \approx 6.67[msec]$$

exists between phases L2 and L3. If a power device determines that about 13.33 milliseconds elapse between phase L2 reaching a peak and phase L3 reaching a peak, the power device may determine that a minus 120-degree phase shift $$\frac{1 \cdot 2}{50\ Hz \cdot 3} \approx 13.33[msec]$$

exists between phases L2 and L3.

If, at step 408, the central controller determines that the L2-L3 phase difference of the first power device is substantially the same as the L2-L3 phase difference of the middle power device (e.g., both phase differences are about 120 degrees, or both phase differences are about −120 degrees). The central controller may proceed to step 410 and establish that the first power device is to the left of middle power device and the second power device is to the right of the middle power device. If, the central controller determines that the L2-L3 phase difference of the first power device is substantially different from the L2-L3 phase difference of the middle power device (e.g., both one phase difference is about 120 degrees, and one phase difference is about −120 degrees). The central controller may proceed to step 412 and establish that the first power device is to the right of middle power device and the second power device is to the left of the middle power device.

According to some aspects of the disclosure herein, step 405 may include comparing phase sequences measured at step 404. For example, if the middle power device and the first power device both have a phase sequence of L1, L2, L3, while the second power device has a phase sequence of L1, L3, L2. The central controller may determine, at step 408, that the first power device and the middle power device have about the same L2-L3 phase difference, and proceed to step 410. If the middle power device has a phase sequence of L1, L2, L3, while the first power device has a phase sequence of L1, L3, L2, the central controller may determine, at step 408, that the first power device and the middle power device have a substantially different L2-L3 phase difference, and proceed to step 412.

Automatic detection of relative position of system power devices 109L and 109R with respect to system power device 109M may enable rapid localization of a malfunction while allowing generic manufacturing and shipping of system power devices 109L and 109R. For example, system power device 109L may be substantially identical to system power device 109R, and the decision which system power device to mount on the right and which system power device to mount on the left may be arbitrarily made by an installer. Once a controller (e.g., a centralized system controller included in or connected to a monitoring system) has established the physical location of each system power device, in case of malfunction of a system power device, the controller may provide an indication (e.g., on a Graphical User Interface or via a message) of the physical location of the malfunctioning device. Where all three power devices 109 may be generic, method 400 may be able to provide an indication that one inverter is to the left or the right of the other the two inverters.

Figure 5A:
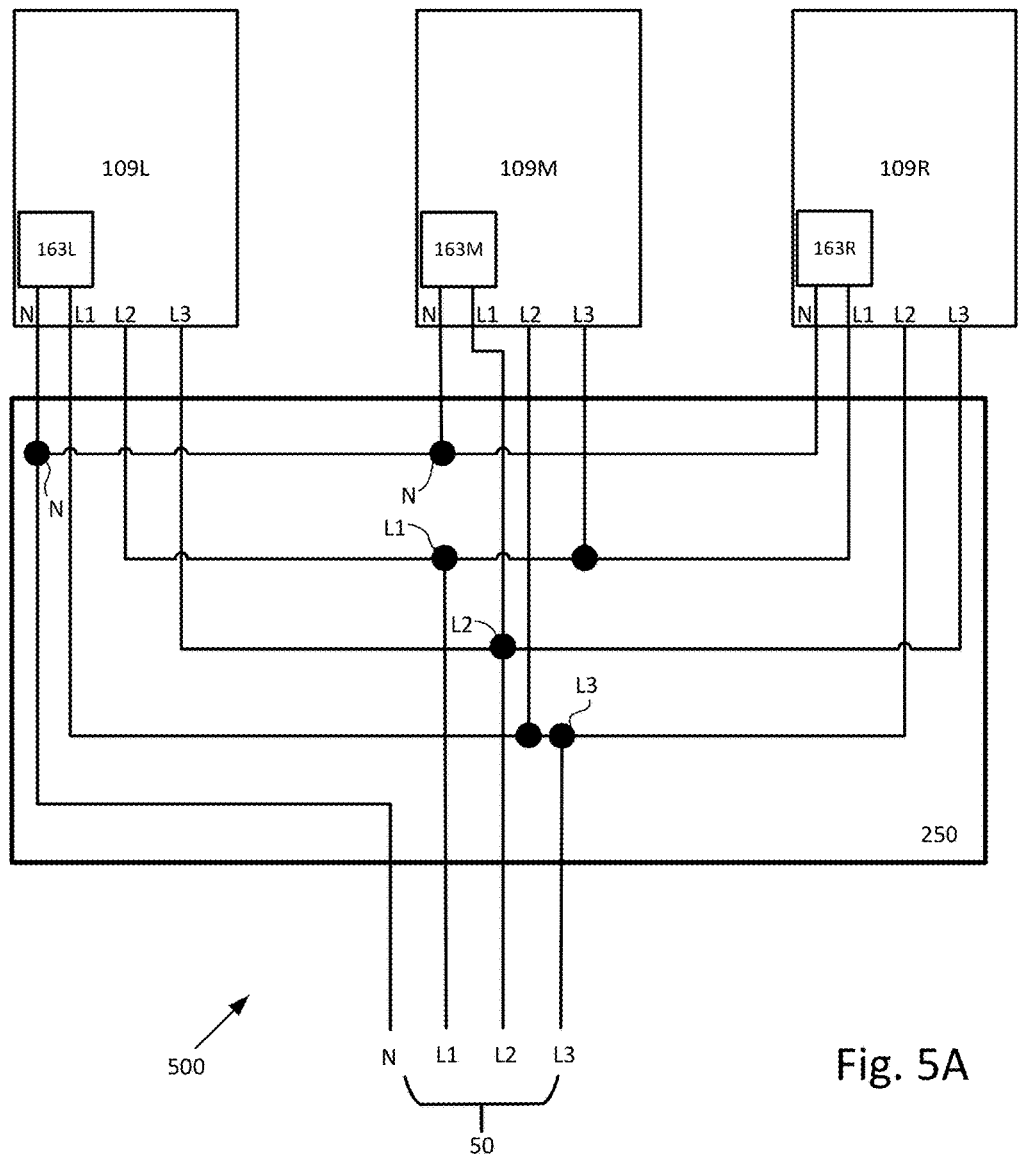
FIG. 5A shows a part system block diagram and part schematic diagram of a more detailed view of the AC three phase connections made in a junction box, according to one or more illustrative aspects of the disclosure.

Reference is now made to FIG. 5A, which shows a part system block diagram and part schematic diagram 500 of a more detailed view of the AC three phase connections made in junction box 250, according to one or more illustrative aspects of the disclosure. The AC three phase connections made in junction box 250 may be in the additional terminal blocks 264 which may be added in order to expand the terminals provided by AC circuit breakers 204. The three-phase output 50 (conductors L1, L2, L3, N, E) from the other side of AC circuit breakers 204 of junction box 250 may be provided via an AC three phase cable attached and secured to the housing of junction box 250 by gland 19. The AC three phase connections made in junction box 250 include a common neutral (N) which connects together the neutral terminals of power devices 109L, 109M and 109R together. The common neutral is also provided to three-phase output 50. Terminal L1 may be provided in the terminals of junction box 250 as the connection between L2 of power device 109L to L3 of power device 109M and L1 of power device 109R. Terminal L2 may be provided in the terminals of junction box 250 as the connection between L3 of power device 109L to L1 of power device 109M and L3 of power device 109R. Terminal L3 may be provided in the terminals of junction box 250 as the connection between L1 of power device 109L to L2 of power device 109M and L2 of power device 109R.

The AC three phase connections made in junction box 250 may be such that auxiliary power circuits 163L, 163M, 163R and their respective power device 109L, 109M, 109R, receive an operating power from AC output phases L1 and neutral (N), L2 and N, L3 and N as opposed to operating power from one phase (L1 for example) and neutral (N). The power from phases L1 and neutral (N), L2 and N, L3 and N to respective power circuits 163L, 163M, and 163R allow for a harmonic distortion as well as load sharing to be shared across phases L1, L2 and L3 as opposed to one phase. Use of one phase as well as not load sharing shared across phases L1, L2 and L3 may not satisfy an operating a code such as German Low Voltage Grid Code VDE-AR-N-4105 (LVGC) for example. LVGC VDE-AR-N-4105 includes requirements related to phase balancing, frequency-based power reduction, reactive power control, inverter reconnection conditions, total harmonic distortion, power factor and output power control. Other international standards for grid converters may include, for example, IEEE 929-2000: Recommended Practice for Utility Interface of Photovoltaic (PV) Systems, IEC 61727; "Characteristics of the utility interface for photovoltaic (PV) systems"; International Electrotechnical Commission, IEC 61727, 2002 and EN61000-3-2-A standard for current harmonics.

As with descriptions above with respect methods 300 and 400, methods 300 and 400 may be applied to the AC three phase connections made in junction box 250 as shown in FIG. 5A. With respect to method 300 where at step 305 circuit breakers 204 terminate the AC cable between power device 109R and the terminals of AC circuit breakers 204. As such, conductors L2 and L3 of the cable may be terminated in respective terminals L3 and L2 of AC circuit breakers 204. In other words, terminals provided by AC circuit breakers 204 labelled as phases L2 and L3 swap phases L3 and L2 of the conductors of the cable. The swap of phases in step 305 and subsequent operation according to the steps of method 400 allows a parameter such as phase difference between phases L1, L2 and L3 to be sensed by sensor 164b/sensor interface 164 of power device 109M at step 403 as result of the conversion of DC power to AC power at step 401. The results of sensing step 403 may be shown in Table 1 and 2 as shown above. Consequently, at step 405, the lateral positions left (L) and right (R) of respective power devices 109L and 109R relative to middle (M) power device 109M can be obtained for example by remote monitoring techniques.

The remote monitoring techniques may be where communications interfaces 166 are connectable to a local network and/or a cellular network. The connection to a local network and/or a cellular network may be in order to establish an internet connection to and/or between power devices 103/power devices 109M, 109L and 109R and link units 107 for example. Step 405 may additionally consider the serial number of power device 109M in order to verify the lateral positions left (L) and right (R) of respective power devices 109L and 109R relative to middle (M) power device 109M. Alternatively or additionally, the phase differences as summarized in Tables 1 and 2 above and/or with the use of proximity sensors 17a and respective targets 17b may be used to obtain and verify the lateral positions left (L) and right (R) of respective power devices 109L and 109R relative to middle (M) power device 109M.

The connections illustrated in FIG. 5A may be summarized as shown in Table 3 below:

TABLE 3

| Power Device | Device L1 is connected to output phase | Device L2 is connected to output phase | Device L3 is connected to output phase |
|---|---|---|---|
| 109L | L3 | L1 | L2 |
| 109M | L2 | L3 | L1 |
| 109R | L1 | L3 | L2 |

Since each auxiliary power circuit 163 may draw power from the neutral (N) and power device L1 terminals, by connecting each L1 system power device terminal to a different phase of three-phase AC output 50. Each auxiliary power circuit 163 may also draw power between phases, for example between phase L1 and L2 or any other combination of phases. The total auxiliary power drawn by system power devices 109L-109R may therefore be divided evenly among the phases of three-phase AC output 50. Auxiliary power drawn evenly may improve the balance and harmonic content of three-phase AC output 50. Further, by system power devices 109L and 109R having different phase sequences (e.g., system power device 109L having a phase sequence of L3-L1-L2 and system power device 109R having a phase sequence of L1-L3-L2). The physical location of system power devices 109L and 109R with reference to system power device 109M (e.g. to the left or right of system power device 109M) may be readily determined as disclosed above.

Figure 5B:
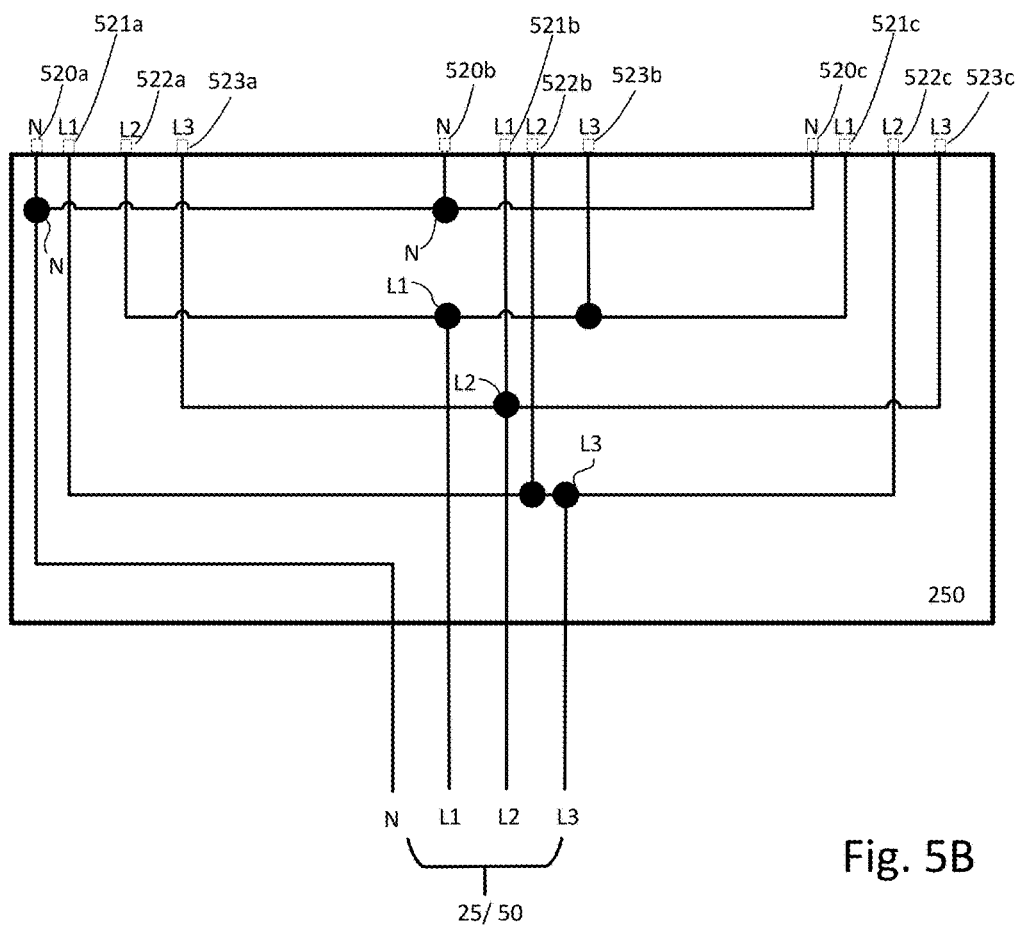
FIG. 5B shows a junction box, according to one or more illustrative aspects of the disclosure.

Reference is now made to FIG. 5B, which shows a junction box 250 according to illustrative features. Junction box 250 may be the same as junction box 250 of FIG. 5A, with connector terminals 520a-520c, 521a-521c, 522a-522c and 523a-523c explicitly shown. Connector terminals 520a-523a may be provided for connecting to a first system power device (e.g. 109L), connector terminals 520b-523b may be provided for connecting to a second system power device (e.g. 109M), and connector terminals 520c-523c may be provided for connecting to a third system power device (e.g. 109R). Each connector terminal may be labeled to indicate an intended use. For example, connector terminal 520a may be labeled 'N', to indicate its intended connection to a neutral terminal connector of a system power device. Connector terminal 521a may be labeled 'L1', to indicate its intended connection to an L1 terminal connector of a system power device, and so on.

Labeling may be done using alphanumeric symbols, for example, or using different colors. In an installation where system power devices also include labeled connector terminals, it may be simple for an installer to connect three system power devices to junction box 250 according to the labels, with a potentially beneficial wiring scheme. The potentially beneficial wiring scheme may already be provided internal to junction box 250 to an installer. Use of the potentially beneficial wiring scheme may decrease the time associated with the system installation. Two of the phases swapped may help determine lateral positions of power converters 109 relative to each other. The other connection described above may also ensure total auxiliary power drawn by system power devices 109L-109R may be divided evenly among the phases of three-phase AC outputs 50.

Figure 5C:
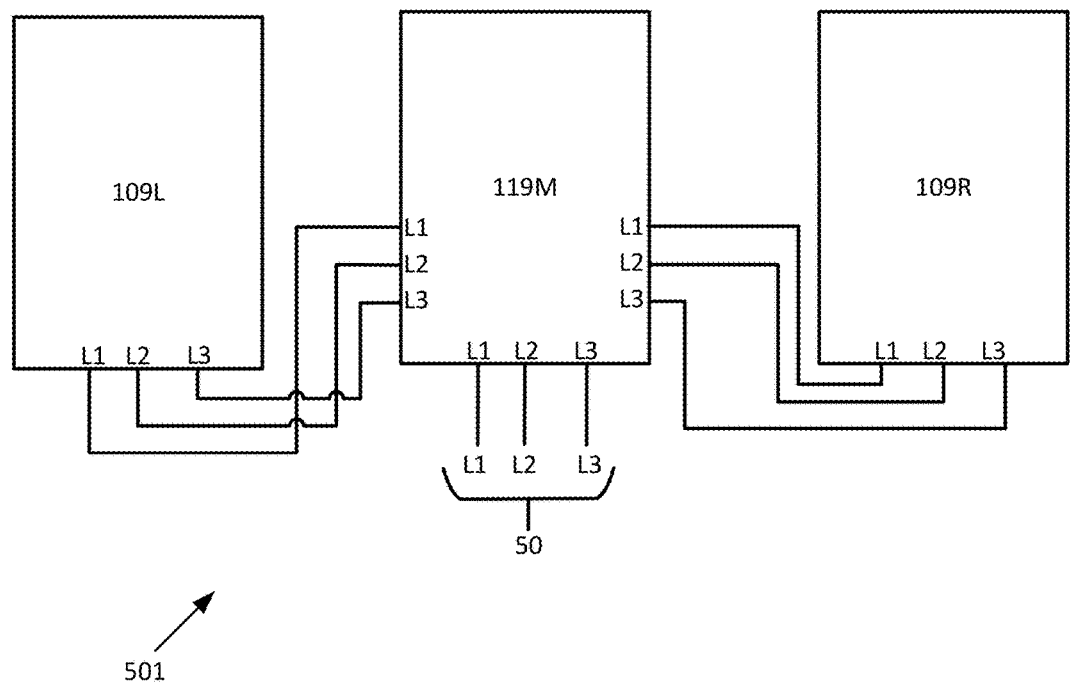
FIG. 5C shows a part system block diagram and part schematic diagram of a more detailed view of AC three phase connections made internally in a system power device, according to one or more illustrative aspects of the disclosure.

Reference is now made to FIG. 5C, which illustrates a part system block diagram and part schematic diagram 501 of a more detailed view of AC three phase connections made internally in a system power device. System power device 119M may be similar to system power device 109M, including integrating some or all of elements and/or functionality of junction box 250 of FIGS. 5A-5B. System power device 119 may include terminals for connecting to phases L1-L3 of system power device 109L and terminals for connecting to phases L1-L3 of system power device 109R. The wiring arrangement combining the AC power of system power devices 109M, 119M and 109R may be implemented similarly to the arrangement shown in FIG. 2C or the arrangement shown in FIG. 5A. Three-phase output 50 may be output directly from system power device 119M.

Figure 6:
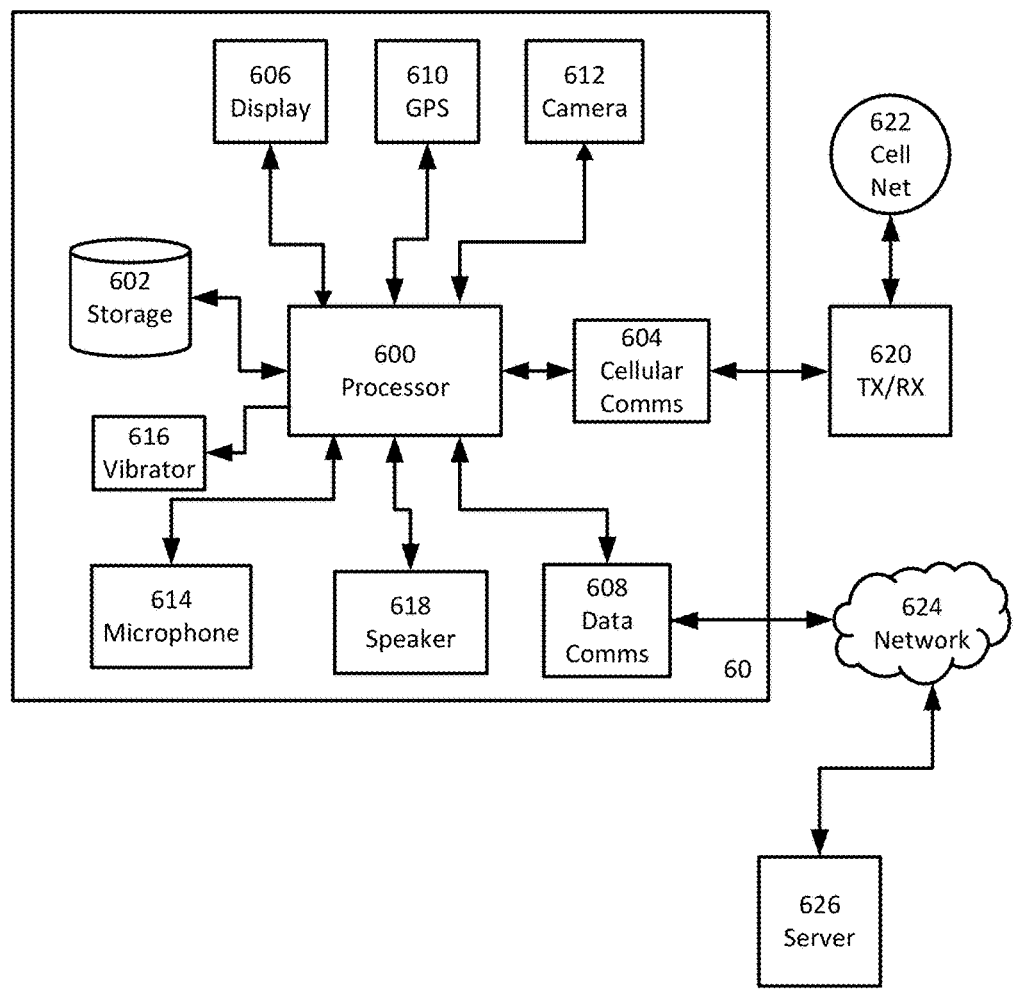
FIG. 6 illustrates a simplified block diagram of a mobile computer system according to one or more illustrative aspects of the disclosure.

Reference is now made to FIG. 6 which illustrates a simplified block diagram of a mobile computer system 60 according to one or more illustrative aspects of the disclosure. Mobile computer system 60 may be, for example, an IPHONE™ of Apple Inc., a laptop computer or a smartphone configured to run an ANDROID™ open operating system. Mobile computer system 60 may be connectible over a network 624 to a server 626. Mobile computer system 60 may be also connectible through a cellular base station transceiver 620 to the remainder of cellular network 622. Mobile computer system 60 may include a processor 600 connected to local data storage 602. A data communications module 608 may connect processor 600 to network 624. A cellular communications module 604 may connect processor 600 to cellular network 622, and cellular network 622 may be further connected to the internet.

Mobile computer system 60 may include one or more devices connected to processor 600. For example, one or more peripheral accessory devices such as a display 606, global positioning system (GPS) 610, camera 612, a microphone 614, a speaker 618, a vibrator 616, accelerometer/gravity sensor/gyroscopic sensor unit 628, BLUETOOTH™, infra-red sensor (not shown). Display 606 may provide a graphical user interface (discussed later) to an operator for an application, which runs on mobile computing system 60. An operator of mobile computer system 60 may be able to operate the graphical user interface in the proximity of power devices 109 (for example power devices 109L, 109M), link units 107 and power devices 103 or remotely via an internet connection. The internet connection may be via a local network and/or a cellular network for example.

Figure 7A:
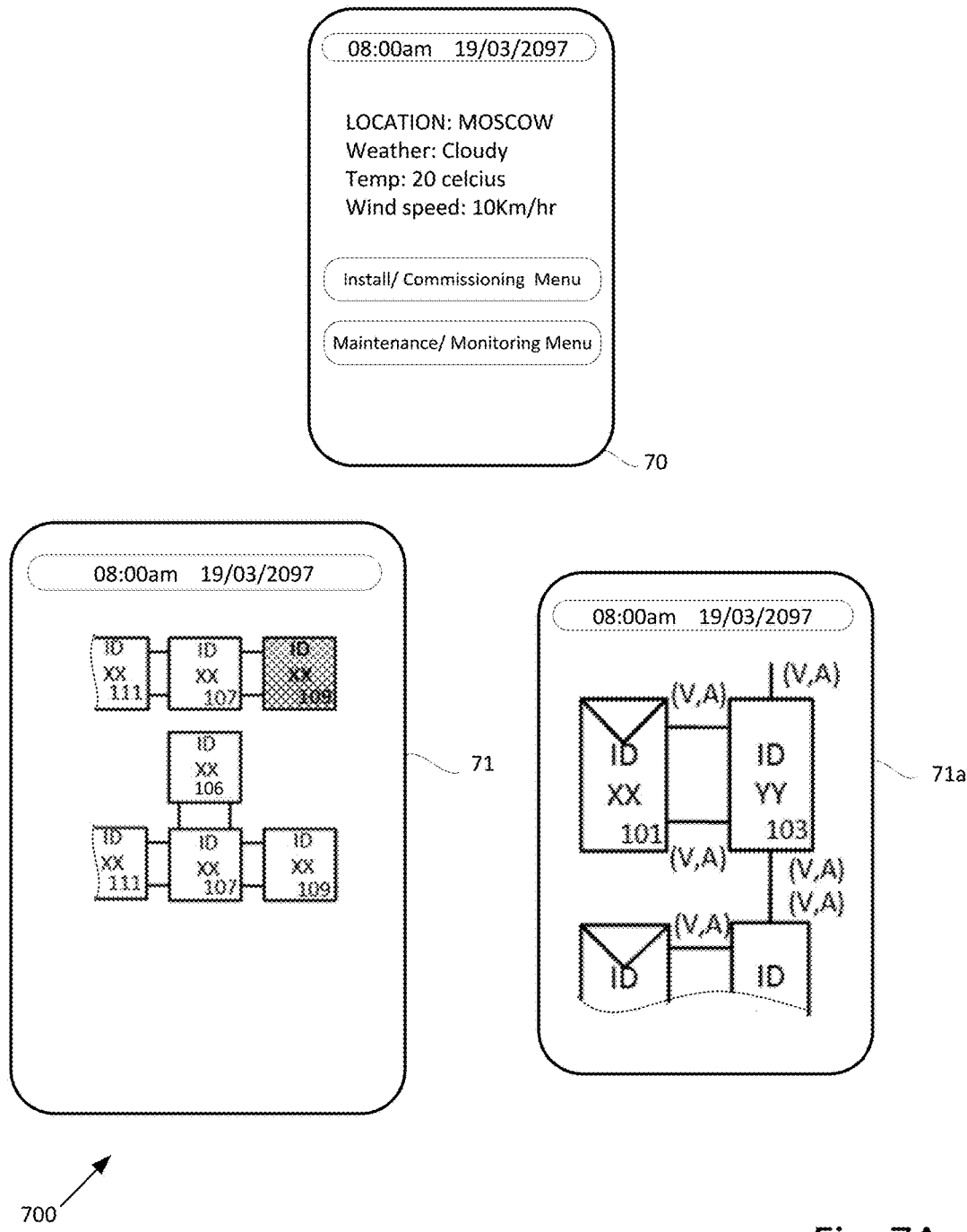
FIGS. 7A and 7B illustrate a graphical user graphical user interface (GUI) which may include various screen portions which may be provided on a display of a mobile computing system, according to one or more illustrative aspects of the disclosure.

Reference is now made to FIG. 7A which illustrates a graphical user interface (GUI) 700, which may include various screen portions of which may be provided on display 606 of mobile computing system 60, according to one or more illustrative aspects of the disclosure. In descriptions which follow, mobile computing system 60 and/or another computing system may be located in the vicinity of power systems 10a/10b and/or remotely via an internet connection for example.

Screen areas 70, 71 and 71a of GUI 700 may be included on one graphical screen or be displayed on different graphical screens (e.g. depending on the screen size available). In the description that follows, a touch screen may be referenced by way of example but other screens such as computer monitors may be used where items may be selected, for example, by mouse and pointer.

In the descriptions which follow, screen areas 70, 71 and 71a of GUI 700 may provide upload and download of data from server 626/network 624, a remote server as well as data from one mobile computing system 60 to another mobile computing system 60 directly. Upload and download of data may also be by use of communication circuits such as communication interfaces 129 and/or data communications module 608, existing communication circuits and/or a combination of retrofit communication circuits, existing communication circuits and power line communications (PLC). The data may include, for example, sensed and measured parameters from sensors/sensor interfaces 125/164 such voltages, currents, power, impedance, power factor, phase angle, harmonic distortion in phases and/or temperature. The data may also include, for example, configuration data or firmware upgrades for link units 107, storage devices 106, power devices 103 and power devices 109 for example.

In general, screen areas each may serve overall as an icon which when touched or swiped by the user using a touch screen device such as a smart phone, allows a number of sub menu options to appear. The sub menu may for example allow the user to view another power system or distinct separate portions of power system.

GUI 700 may include, for example, a master screen area 70 which may give a user information as to the location of power systems 10a/10b for example. The local time and date, an indication as to the weather conditions at the location, temperature at the location and the wind speed at the location of a power system 10a/10b. The local time and date may be common to each of the screen areas described below but other information may be displayed also or in addition to the local time and date for example. Two example menu buttons are displayed which may give two example usages of an application running on mobile computing system 60 via two menu buttons: a maintenance/monitoring menu button, an installer's/commissioning menu button. Other buttons may be added, such as the provision of a site management function for example. In the description that follows each of the screen areas may be presented to a user regardless of which of the two buttons is selected. However, each screen area whilst similar in appearance may present different options to the user depending on which of the two buttons is selected. Access and/or levels of access may also be provided to various screen areas by use of usernames and passwords for example.

Screen area 71 may include (e.g., in response to the install/commissioning button being selected by a user) a partial topographical map and/or system block diagram. The partial topographical map and/or system block diagram may show inputs and outputs between wiring configurations 111, link units 107, storage devices 106 and power devices 109 of power systems 10a/10b for example. The other components of power systems 10a/10b may be revealed by swipe of a finger of the user across the screen of mobile computing device 60. The partial topographical map and/or system block diagram may be preloaded into mobile computing device 60. The preloading may be as a result of a design specification for power systems 10a/10b or may be added as part of a mapping algorithm used by a user/installer as they go about installing and/or commissioning components of power systems 10a/10b.

Functionality of screen 71 may allow the user/installer to enter an ID number for a component of power systems 10a/10b. How each of the components are connected to each other electrically as well as how the components are mapped in terms of location and adjacencies to each other. For example, screen area 71a may be a sub screen area if a wiring configuration 111 icon is pressed. The sub screen may show further details of wiring configuration 111 to include a string of power devices 103 outputs, where the input of each power device 103 is connected to a power source 101 (photovoltaic panel for example).

Screen 71a my further include ID numbers to be entered for each component, to display designed voltages (V) and currents (A) as well as for example to allow a user/installer to enter the angle of a photovoltaic (PV) panel and/or location of the PV panel/power source 101 for example. Screen area 71a may (e.g., in response to the install/commissioning button being selected by a user) allow fault finding in the string by activating bypass units Q9 with respect to power devices 103. The results of the activation of bypass units Q9 may be monitored in terms of voltages (V) and currents (A) sensed by sensors/sensor interfaces 125 in screen area 71a. For example, a lower than expected string current in the string and the use of bypass units Q9 may help to identify a faulty power source 101 and/or power circuit 135 for example. Monitoring and operation of bypass units Q9 of the string may be when an operative is in the proximity of the components of power systems 10a and 10b with mobile computing device 60 and/or be connected to a local network and/or a cellular network. Connection to a local network and/or a cellular network may be in order to establish an internet connection to and/or between power devices 103/power devices 109M, 109L and 109R and link units 107 for example.

Figure 7B:
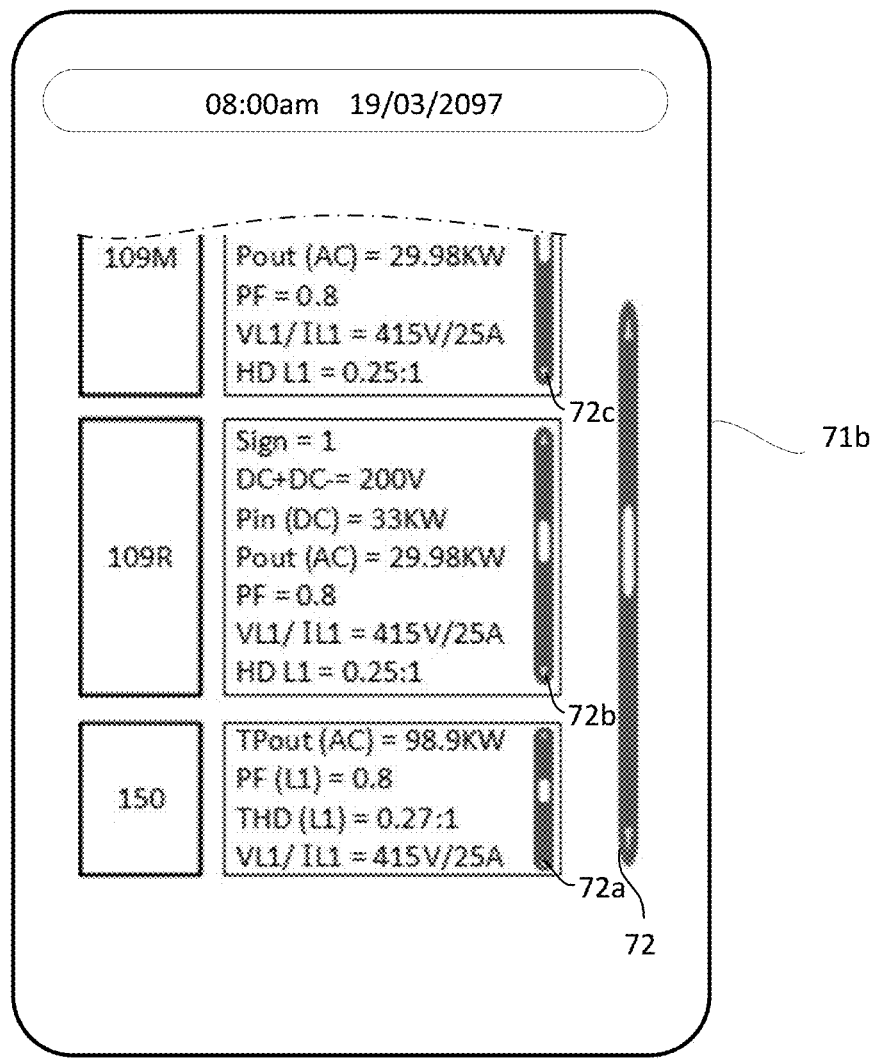

Reference is now made to FIG. 7B which illustrates a graphical user interface (GUI) 700, which may include various screen portions of graphical user interface (GUI) 700, according to one or more illustrative aspects of the disclosure. In the context of the install/commissioning button being selected by a user, screen area 71b may be a sub screen as a result of pressing the power device 109 icon shown by hashed lines in screen area 71. Pressing the power converter icon may reveal in screen area 71b power devices 109L, 109M, 109R and junction box 250 according to features described above with respect to the parallel connection of power devices 109L, 109M and 109R to provide a combined AC three phase output. Screen area 71b provides a vertical slider 72 to show further details of power device 109M (partially shown) and power device 109L (not shown). Additional operating features of junction box 250, power device 109R and power device 109M may be revealed by respective vertical sliders 72a, 72b and 72c. In the context of the install/commissioning button being selected by a user, in screen area 71b, if the icon for junction box 250 is pressed may allow an installer to view a wiring diagram for junction box 250 similar to FIG. 2A for example. The wiring diagram may show how the electrical wires or conductors to the components of junction box 250 such as DC circuit breakers 206, isolation switch 254 and how they relate to AC circuit breakers 204 for example. Conductors of AC cables may be labelled as L1, L2 and L3 or may color coded such that L1, L2 and L3 correspond respectively red, yellow and blue for example.

With respect to the context of installation and commissioning, details of the operating parameters displayed may be as a result of a provision of a configuration to power devices 109L, 109M and 109R. The configuration may be when an installer with mobile computing system 60 and/or another computing system is located in the vicinity of power systems 10a/10b and/or remotely via an internet connection for example. The configuration for example may include configuration parameters for power devices 109L, 109M and 109R to share the power conversion by system power devices 109L, 109M and 109R to a load according to a prescribed function. The prescribed function may allow each system power device 109L, 109M and 109R to autonomously determine its share of power conversion. Each system power device 109L, 109M and 109R may then operate according to its own power conversion formula/function, such that overall the parallel connected system power devices 109L, 109M and 109R share the power conversion to a load in a predetermined manner.

With respect to the context of commissioning, monitoring/sensing (step 403) the operating parameters for power device 109R with sensors 164a/164b for example may include a sign value: Sign=1 as shown and described above with respect to Table 2. Sign=1 may indicate that power device 109R is positioned laterally to the right (R) of power device 109M. Where with respect to power device 109L sign value: Sign=−1 indicates that power device 109L is positioned laterally to the left (L) of power device 109M. Commissioning, monitoring/sensing (step 403) mode may help a user to identify and/or confirm that power device 109R is positioned laterally to the right (R) of power device 109M. Commissioning, monitoring/sensing (step 403) may be by a user in proximity to power devices 109L, 109M and 109R or remotely connected by an internet connection. As such, according to method 400 described above and utilized in screen area 71b, a user may be able to positionally locate power devices 109L, 109M and 109R lateral positions to each other and ensure that monitored or sensed parameters may be properly ascribed to each of the power devices 109L, 109M and 109R. Sensors 164a and 164b and the other sensors of sensor interface 164 may sense electrical parameters such as DC voltage and/or current input on the DC at terminals DC+ and DC−. Sensed electrical parameter may further include the AC the three phase voltages of the three-phase output on terminals L1, L2 and L3. Other parameters sensed by the sensors and sensors 164a and 164b may include phase differences between three phase voltages on terminals L1, L2 and L3, frequencies of three phase voltages on terminals L1, L2 and L3, total harmonic distortion (THD) on three phase voltages on terminals L1, L2 and L3, power factors of three phase voltages on terminals L1, L2 and L3 or temperature of heatsinks and/or switching devices utilized in power switching circuitry 160.

One or more illustrative aspects of the disclosure herein may include a general-purpose or special-purpose computer system including various computer hardware components, which are discussed in greater detail below. Various aspects of the disclosure herein may also include computer-readable media for carrying or having computer-executable instructions, computer-readable instructions, or data structures stored thereon. Such computer-readable media may be any available media, which may be accessible by a general-purpose or special-purpose computer system. By way of example, and not limitation, such computer-readable media can include non-transitory computer-readable media. Such computer-readable media can include physical storage media such as RAM, ROM, EPROM, flash disk, CD-ROM or other optical disk storage, magnetic disk storage or other magnetic storage devices, or any other media which can be used to carry or store desired program code mechanisms in the form of computer-executable instructions, computer-readable instructions, or data structures and which may be accessed by a general-purpose or special-purpose computer system.

In this description and in the following claims, a "computer system" may be defined as one or more software or firmware modules, one or more hardware modules, or combinations thereof, which work together to perform operations on electronic data. For example, the definition of computer system may include the hardware components of a personal computer, as well as software or firmware modules, such as the operating system of the personal computer. The physical layout of the modules may be not important. A computer system may include one or more computers connected via a computer network. Likewise, a computer system may include a single physical device (such as a smartphone) where internal modules (such as a memory and processor) work together to perform operations on electronic data. While any computer system may be mobile, the term "mobile computer system" especially may include laptop computers, net-book computers, cellular telephones, smartphones, wireless telephones, personal digital assistants, portable computers with touch sensitive screens and the like.

In this description and in the following claims, a "network" may be defined as any architecture where two or more computer systems may exchange data. The term "network" may include wide area network, Internet local area network, Intranet, wireless networks such as "Wi-Fi", virtual private networks, mobile access network using access point name (APN) and Internet. Exchanged data may be in the form of electrical signals that are meaningful to the two or more computer systems. When data may be transferred, or provided over a network or another communication connection (either hard wired, wireless, or a combination of hard wired or wireless) to a computer system or computer device, the connection may be properly viewed as a computer-readable medium. Thus, any such connection may be properly termed a computer-readable medium. Combinations of the above should also be included within the scope of computer-readable media. Computer-executable instructions include, for example, instructions and data which cause a general-purpose computer system or special-purpose computer system to perform a certain function or group of functions.

The term "server" as used herein, refers to a computer system including a processor, data storage and a network adapter generally configured to provide a service over the computer network. A computer system which receives a service provided by the server may be known as a "client" computer system. The term "data" as used herein may refer to a processed analogue signal, the processing including analogue to digital conversion into digital information accessible to a computer system.

It may be noted that various connections are set forth between elements herein. These connections are described in general and, unless specified otherwise, may be direct or indirect; this specification may be not intended to be limiting in this respect. Further, elements of one aspect of the disclosure (and/or one case) may be combined with elements from other aspects of the disclosure (and/or other cases) in appropriate combinations or sub-combinations.

Aspects of the disclosure have been described in terms of examples. While illustrative systems and methods as described herein embodying various aspects of the present disclosure are shown, it will be understood that modifications may be made by in light of the foregoing teachings. For example, each of the features of the aforementioned examples may be utilized alone or in combination or sub-combination with elements of the other examples. For example, any of the above described systems and methods or parts thereof may be combined with the other methods and systems or parts thereof described above. For example, the steps shown in the figures may be performed in other than the recited order, and one or more steps shown may be optional in accordance with aspects of the disclosure. It will also be appreciated and understood that modifications may be made without departing from the scope of the present disclosure. The description is thus to be regarded as illustrative instead of restrictive on the present disclosure.

Various features are further described in the following additional clauses:

Clause 1. An apparatus comprising:
a plurality of direct current (DC) to alternating current (AC) three phase inverters connected in a parallel connection, wherein the parallel connection includes:
at least one pair of DC input terminals; and
a three-phase output including a first phase, a second phase and a third phase provided respectively on a first phase AC output terminal, a second phase AC output terminal and a third phase AC output terminal,
wherein two of conductors of the three phases of a three-phase output of at least one of the DC to AC three phase inverters are swapped and connected by the three-phase output to at least one of: the first phase AC output terminal, the second phase AC output terminal, or the third phase AC output terminal.

Clause 2. The apparatus of clause 1, wherein the DC to AC three phase inverters are configured to convert DC power on the at least one pair of DC input terminals to a combined AC power on the first phase AC output terminal, the second phase AC output terminal and the third phase AC output terminal.

Clause 3. The apparatus of clause 1, wherein one of the three AC output terminals of one of the DC to AC three phase inverters is connected to one of the three AC output terminals of another one of the DC to AC three phase inverters, and
wherein the one of the three AC output terminals of one of the DC to AC three phase inverters provides a different phase compared to the one of the three AC output terminals of the another one of the DC to AC three phase inverters.

Clause 4. The apparatus of clause 3, wherein the plurality of the DC to AC three phase inverters comprise a first DC to AC three phase inverter, a second DC to AC three phase inverter, and a third DC to AC three phase inverter, the first DC to AC three phase inverter is laterally positioned on the left of the second DC to AC three phase inverter, and the third DC to AC three phase inverter is laterally positioned on the right of the second DC to AC three phase inverter.

Clause 5. The apparatus of clause 4, wherein the first phase AC output terminal of the first DC to AC three phase inverter is connected to the first phase AC output terminal of the second DC to AC three phase inverter and to the first phase AC output terminal of the third DC to AC three phase inverter,
wherein the second phase AC output terminal of the first DC to AC three phase inverter is connected to the second phase AC output terminal of the second DC to AC three phase inverter and to the third phase AC output terminal of the third DC to AC three phase inverter, and
wherein the third phase AC output terminal of the first DC to AC three phase inverter is connected to the third phase AC output terminal of the second DC to AC three phase inverter and to the second phase AC output terminal of the third DC to AC three phase inverter.

Clause 6. The apparatus of clause 5, further comprising:
a first phase output that is connected to the first phase AC output terminal of the first DC to AC three phase inverter, the first phase AC output terminal of the second DC to AC three phase inverter, and the first phase AC output terminal of the third DC to AC three phase inverter,
a second phase put that is connected to the second phase AC output terminal of the first DC to AC three phase inverter, the second phase AC output terminal of the second DC to AC three phase inverter, and the third phase AC output terminal of the third DC to AC three phase inverter, and
a third phase output that is connected to the third phase AC output terminal of the first DC to AC three phase inverter, the third phase AC output terminal of the second DC to AC three phase inverter, and the second phase AC output terminal of the third DC to AC three phase inverter.

Clause 7. The apparatus of clause 4, wherein the first phase AC output terminal of the first DC to AC three phase inverter is connected to the second phase AC output terminal of the second DC to AC three phase inverter and to the second phase AC output terminal of the third DC to AC three phase inverter,
wherein the second phase AC output terminal of the first DC to AC three phase inverter is connected to the third phase AC output terminal of the second DC to AC three phase inverter and to the first phase AC output terminal of the third DC to AC three phase inverter, and
wherein the third phase AC output terminal of the first DC to AC three phase inverter is connected to the first phase AC output terminal of the second DC to AC three phase inverter and to the third phase AC output terminal of the third DC to AC three phase inverter.

Clause 8. The apparatus of clause 7, further comprising:
a first phase output that is connected to the second phase AC output terminal of the first DC to AC three phase inverter, the third phase AC output terminal of the second DC to AC three phase inverter, and the first phase AC output terminal of the third DC to AC three phase inverter,
a second phase put that is connected to the third phase AC output terminal of the first DC to AC three phase inverter, the first phase AC output terminal of the second DC to AC three phase inverter, and the third phase AC output terminal of the third DC to AC three phase inverter, and
a third phase output that is connected to the first phase AC output terminal of the first DC to AC three phase inverter, the second phase AC output terminal of the second DC to AC three phase inverter, and the second phase AC output terminal of the third DC to AC three phase inverter.

Clause 9. A method for a plurality of direct current (DC) to alternating current (AC) three phase inverters connected in a parallel connection, the method comprising:
mounting and positioning the DC to AC three phase inverters, wherein at least one of the DC to AC three phase inverters is laterally positioned to the left or to the right of another DC to AC three phase inverters;
providing for the parallel connection between at least one pair of DC input terminals and a three-phase output including a first phase, a second phase and a third phase provided respectively on a first phase AC output terminal, a second phase AC output terminal and a third phase AC output terminal; and
in the parallel connection, swapping and connecting two conductors of the three phases of a three-phase output of at least one of the DC to AC three phase inverters to at least one of: the first phase AC output terminal, the second phase AC output terminal, or the third phase AC output terminal.

Clause 10. The method of clause 9, wherein the swapping and connecting comprises:
connecting one of the three AC output terminals of one of the DC to AC three phase inverters is connected to one of the three AC output terminals of another one of the DC to AC three phase inverters,
wherein the one of the three AC output terminals of one of the DC to AC three phase inverters provides a different phase compared to the one of the three AC output terminals of the another one of the DC to AC three phase inverters.

Clause 11. The method of clause 9, further comprising:
converting DC power on the at least one pair of DC input terminals to a combined AC power on the first phase AC output terminal, the second phase AC output terminal and the third phase AC output terminal;
sensing a parameter on at least one of: the first phase AC output terminal, the second phase AC output terminal, or the third phase AC output terminal; and
verifying, responsive to the sensing and the mounting, the lateral positioning of the DC to AC three phase inverters to each other.

Clause 12. The method of clause 9, clause 10, or clause 11 further comprising:
providing an auxiliary power to each the DC to AC three phase inverters from at least one of: the first phase AC output terminal and a neutral terminal, the second phase AC output terminal and the neutral terminal, or the third phase AC output terminal and the neutral terminal.

Clause 13. The method of clause 11 or clause 12, wherein the parameter is selected from at least one of: voltage, current, frequency phase angle, power factor, impedance, harmonic distortion or temperature.

Clause 14. The method of clause 9, wherein the plurality of the DC to AC three phase inverters comprise a first DC to AC three phase inverter, a second DC to AC three phase inverter, and a third DC to AC three phase inverter, the first DC to AC three phase inverter is laterally positioned on the left of the second DC to AC three phase inverter, and the third DC to AC three phase inverter is laterally positioned on the right of the second DC to AC three phase inverter.

Clause 15. The method of clause 14, further comprising:
connecting the first phase AC output terminal of the first DC to AC three phase inverter to the first phase AC output terminal of the second DC to AC three phase inverter and to the first phase AC output terminal of the third DC to AC three phase inverter,
connecting the second phase AC output terminal of the first DC to AC three phase inverter to the second phase AC output terminal of the second DC to AC three phase inverter and to the third phase AC output terminal of the third DC to AC three phase inverter, and
connecting the third phase AC output terminal of the first DC to AC three phase inverter to the third phase AC output terminal of the second DC to AC three phase inverter and to the second phase AC output terminal of the third DC to AC three phase inverter.

Clause 16. The method of clause 15, further comprising:
connecting a first phase output to the first phase AC output terminal of the first DC to AC three phase inverter, the first phase AC output terminal of the second DC to AC three phase inverter, and the first phase AC output terminal of the third DC to AC three phase inverter,
connecting a second phase put to the second phase AC output terminal of the first DC to AC three phase inverter, the second phase AC output terminal of the second DC to AC three phase inverter, and the third phase AC output terminal of the third DC to AC three phase inverter, and
connecting a third phase output to the third phase AC output terminal of the first DC to AC three phase inverter, the third phase AC output terminal of the second DC to AC three phase inverter, and the second phase AC output terminal of the third DC to AC three phase inverter.

Clause 17. The method of clause 14, further comprising:
connecting the first phase AC output terminal of the first DC to AC three phase inverter to the second phase AC output terminal of the second DC to AC three phase inverter and to the second phase AC output terminal of the third DC to AC three phase inverter,
connecting the second phase AC output terminal of the first DC to AC three phase inverter to the third phase AC output terminal of the second DC to AC three phase inverter and to the first phase AC output terminal of the third DC to AC three phase inverter, and
connecting the third phase AC output terminal of the first DC to AC three phase inverter to the first phase AC output terminal of the second DC to AC three phase inverter and to the third phase AC output terminal of the third DC to AC three phase inverter.

Clause 18. The method of clause 17, further comprising:
connecting a first phase output to the second phase AC output terminal of the first DC to AC three phase inverter, the third phase AC output terminal of the second DC to AC three phase inverter, and the first phase AC output terminal of the third DC to AC three phase inverter,
connecting a second phase put to the third phase AC output terminal of the first DC to AC three phase inverter, the first phase AC output terminal of the second DC to AC three phase inverter, and the third phase AC output terminal of the third DC to AC three phase inverter, and connecting a third phase output to the first phase AC output terminal of the first DC to AC three phase inverter, the second phase AC output terminal of the second DC to AC three phase inverter, and the second phase AC output terminal of the third DC to AC three phase inverter.

Clause 19. A non-transitory computer readable medium having program code recorded thereon which, when executed by one or more processors, causes the one or more processors to:
sense with a sensor at least one phase difference between at least two phases of a group of parallel connected 3 phase AC output terminals, wherein the parallel connected AC output terminals are three parallel connected DC to AC three phase inverters, wherein the 3 phase AC output terminals are selected from a group comprising of at least one of: a first phase AC output terminal, a second phase AC output terminal, or a third phase AC output terminal, wherein wiring of conductors to at least one phase of an AC output terminal is swapped by the AC output terminals with wiring of conductors of at least one phase of another phase AC output terminal; and
verify that a sign of at least one phase difference is different to signs of other phase differences to determine a lateral position of at least one three phase inverters relative to at least one other of the three phase inverters.

Clause 20. The non-transitory computer readable medium of clause 19, wherein the program code, when executed by the one or more processors, further causes the one or more processors to:
connect one of the 3 phase AC output terminals of one of the DC to AC three phase inverters is connected to one of the 3 phase AC output terminals of another one of the DC to AC three phase inverters,
wherein the one of the 3 phase AC output terminals of one of the DC to AC three phase inverters provides a different phase compared to the one of the 3 phase AC output terminals of the another one of the DC to AC three phase inverters.

Clause 21. An apparatus comprising:
a first set of input terminals, a second set of input terminals and a third set of input terminals, wherein each set of input terminals comprises a first phase input terminal, a second phase input terminal and a third phase input terminal, and the first, second and third input terminals are labeled as first, second and third terminals, respectively; and a set of output terminals comprising a first phase output terminal, a second phase output terminal and a third phase output terminal,
wherein the first phase input terminal of the first set of input terminals is connected to the first phase input terminal of the second set of input terminals, the first phase input terminal of the third set of input terminals and to the first phase output,
wherein the second phase input terminal of the first set of input terminals is connected to the second phase input terminal of the second set of input terminals, the third phase input terminal of the third set of input terminals and to the second phase output, and
wherein the third phase input terminal of the first set of input terminals is connected to the third phase input terminal of the second set of input terminals, the second phase input terminal of the third set of input terminals and to the third phase output.

Clause 22. The apparatus of clause 21, wherein the first, second and third input terminals are labeled as first, second and third terminals, respectively, using alphanumeric characters.

Clause 23. The apparatus of clause 21 or clause 22, wherein the first, second and third input terminals are labeled as first, second and third terminals, respectively, using a first color to label the first input terminal, a second color to label the second input terminal and a third color to label the third input terminal.

Clause 24. An apparatus comprising:
a first set of input terminals, a second set of input terminals and a third set of input terminals, wherein each set of input terminals comprises a first phase input terminal, a second phase input terminal and a third phase input terminal, and the first, second and third input terminals are labeled as first, second and third terminals, respectively; and
a set of output terminals comprising a first phase output terminal, a second phase output terminal and a third phase output terminal,
wherein the first phase input terminal of the first set of input terminals is connected to the second phase input terminal of the second set of input terminals, the second phase input terminal of the third set of input terminals and to the third phase output,
wherein the second phase input terminal of the first set of input terminals is connected to the third phase input terminal of the second set of input terminals, the first phase input terminal of the third set of input terminals and to the first phase output; and
wherein the third phase input terminal of the first set of input terminals is connected to the first phase input terminal of the second set of input terminals, the third phase input terminal of the third set of input terminals and to the second phase output.

Clause 25. The apparatus of clause 24, wherein the first phase input terminal of each of the first set of input terminals, the second set of input terminals and the third set of input terminals is connected to a respective auxiliary power circuit.

Clause 26. A method comprising:
connecting output terminals of three DC/AC three-phase converters in parallel,
creating a combined three-phase AC output,
drawing power from a first phase of the three-phase AC output to provide auxiliary power to a first DC/AC converter,
drawing power from a second phase of the three-phase AC output to provide auxiliary power to a second DC/AC converter, and
drawing power from a third phase of the three-phase AC output to provide auxiliary power to a third DC/AC converter.

Clause 27. The method of clause 26, wherein connecting output terminals of three DC/AC three-phase converters in parallel comprises:
connecting each of a first labeled phase terminal, a second labeled phase terminal and a third labeled phase terminal to a correspondingly labeled terminal.

Clause 28. The method of clause 26 or clause 27, wherein the three DC/AC three phase converters draw auxiliary power from substantially identically-labeled phases.

What is claimed is:
1. An apparatus comprising:
a plurality of direct current (DC) to alternating current (AC) three phase inverters, wherein each of the plurality of inverters includes:
a plurality of AC output terminals including: a first phase output terminal, a second phase output terminal, and a third phase output terminal; and a junction box with a plurality of AC input terminals including: a first phase input terminal, a second phase input terminal, and a third phase input terminal;

wherein the first phase output terminal of a first inverter of the plurality of inverters and the first phase output terminal of a second inverter of the plurality of inverters are both connected to the first phase input terminal; and wherein the second phase output terminal of the first inverter and the third phase output terminal of the second inverter are both connected to the second phase input terminal.

2. The apparatus of claim 1, further comprising a controller configured to determine a position of the second inverter relative to the first inverter based on a parameter related to at least one of the AC input terminals.

3. The apparatus of claim 2, wherein the parameter is at least one of: voltage, current, frequency, phase angle, power factor, impedance, harmonic distortion, and temperature.

4. The apparatus of claim 2, wherein the plurality of inverters further comprise a third inverter, and the controller is configured to determine a position of the third inverter relative to the first inverter.

5. The apparatus of claim 4, wherein the first phase output terminal of the third inverter is connected to the first phase input terminal;

wherein the second phase output terminal of the third inverter is connected to the second phase input terminal; and wherein the third phase output terminal of the first inverter, the second phase output terminal of the second inverter, and the third phase output terminal of the third inverter are connected to the third phase input terminal.

6. The apparatus of claim 1, wherein the junction box includes: a first phase output terminal, a second phase output terminal, and a third phase output terminal.

7. The apparatus of claim 4, wherein the second inverter and the third inverter are positioned on opposite sides of the first inverter.

8. The apparatus of claim 2, wherein the parameter is at least one phase difference between at least two phases of AC current.

9. A method comprising:
connecting a plurality of direct current (DC) to alternating current (AC) three phase inverters to a junction box;
wherein each of the plurality of inverters includes a plurality of AC output terminals including: a first phase output terminal, a second phase output terminal, and a third phase output terminal; and
wherein the junction box includes a plurality of AC input terminals including: a first phase input terminal, a second phase input terminal, and a third phase input terminal;
the connecting comprising:
connecting both the first phase output terminal of a first inverter of the plurality of inverters and the first phase output terminal of a second inverter of the plurality of inverters to the first phase input terminal; and
connecting both the second phase output terminal of the first inverter and the third phase output terminal of the second inverter to the second phase input terminal.

10. The method of claim 9, further comprising: determining a position of the second inverter relative to the first inverter based on a parameter related to at least one of the AC input terminals.

11. The method of claim 10, wherein the parameter is at least one of: voltage, current, frequency phase angle, power factor, impedance, harmonic distortion, and temperature.

12. The method of claim 9, further comprising:
connecting the first phase output terminal of a third inverter of the plurality of inverters to the first phase input terminal;
connecting the second phase output terminal of the third inverter to the second phase input terminal; and
connecting the third phase output terminal of the first inverter, the second phase output terminal of the second inverter, and the third phase output terminal of the third inverter to the third phase input terminal.

13. A non-transitory computer readable medium having program code recorded thereon which, when executed by one or more processors, causes the one or more processors to:
obtain a parameter related to a plurality of three phase Alternating Current (AC) input terminals, the plurality of input terminals including: a first phase input terminal, a second phase input terminal, and a third phase input terminal,
wherein input terminals are connected to a plurality of Direct Current (DC) to AC three phase inverters,
wherein each of the plurality of inverters includes: a first phase output terminal, a second phase output terminal, and a third phase output terminal,
wherein the first phase output terminal of a first inverter and the first phase output terminal of a second inverter are both connected to the first phase input terminal, and
wherein the second phase output terminal of the first inverter and the third phase output terminal of the second inverter are both connected to the second phase input terminal; and
determine a position of the second inverter relative to the first inverter based on the parameter.

14. The non-transitory computer readable medium of claim 13, wherein the parameter is at least one of: voltage, current, frequency, phase angle, power factor, impedance, harmonic distortion, and temperature.

15. The non-transitory computer readable medium of claim 13, wherein the parameter is at least one phase difference between at least two phases of AC current.

16. The apparatus of claim 1, wherein the third phase output terminal of the first inverter and the second phase output terminal of the second inverter are both connected to the third phase input terminal.

17. The apparatus of claim 4, wherein the third inverter is substantially identical to the second inverter.

18. The apparatus of claim 4, wherein locations of the first, second, and third phase output terminals of the third inverter relative to each other correspond to locations of first, second, and third phase output terminals, respectively, of the second inverter.

19. The apparatus of claim 4, wherein the output terminals of the third inverter and the second inverter are labeled according to their relative positions in the given inverter.

20. The method of claim 12, wherein locations of the first, second, and third phase output terminals of the third inverter relative to each other correspond to locations of the first, second, and third phase output terminals, respectively, of the second inverter.

21. The method of claim 10, wherein the parameter is at least one phase difference between at least two phases of AC current.

* * * * *